(12) United States Patent
Fukunaga et al.

(10) Patent No.: US 6,516,016 B1
(45) Date of Patent: Feb. 4, 2003

(54) HIGH-POWER SEMICONDUCTOR LASER DEVICE HAVING CURRENT CONFINEMENT STRUCTURE AND INDEX-GUIDED STRUCTURE, AND OSCILLATING IN TRANSVERSE MODE

(75) Inventors: Toshiaki Fukunaga, Kaisei-machi (JP); Mitsugu Wada, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 24 days.

(21) Appl. No.: 09/715,192

(22) Filed: Nov. 20, 2000

(30) Foreign Application Priority Data

Nov. 19, 1999 (JP) ............................................ 11-329866
Feb. 9, 2000 (JP) ....................................... 2000-031733

(51) Int. Cl.⁷ ................................................. H01S 5/00
(52) U.S. Cl. ......................................... 372/45; 372/46
(58) Field of Search .............................. 372/45, 46, 43, 372/44

(56) References Cited

U.S. PATENT DOCUMENTS

| | | | | |
|---|---|---|---|---|
| 5,379,312 A | * | 1/1995 | Bour et al. ................... | 372/45 |
| 5,395,792 A | * | 3/1995 | Ikawa et al. .................. | 438/43 |
| 6,028,874 A | * | 2/2000 | Wada et al. ................... | 372/45 |
| 6,055,255 A | * | 4/2000 | Suyama et al. ................ | 372/46 |
| 6,118,800 A | * | 9/2000 | Kidoguich et al. ........... | 372/46 |
| 6,130,108 A | * | 10/2000 | Uchida ........................ | 438/46 |
| 6,356,572 B1 | * | 3/2002 | Tanaka et al. ................. | 372/45 |

FOREIGN PATENT DOCUMENTS

JP        11-74620        3/1999    ............ H01S/3/18

OTHER PUBLICATIONS

Akihiro Shima, et al "0.78– and 0.98–$\mu$m Rodge–Waveguide Lasers Buried with AlGaAs Confinement Layer Selectively Grown by Chloride–Assisted MOCVD", IEEE Journal of Selected Topics in Quantum Electronics. vol. 1, No.2, Jun. 1995.

Shin Ishikawa, et al "0.98–1.02 $\mu$m Strained InGaAs/AlGaAs Double Qunatum–Well High–Power Lasers with GaInP Buried Waveguides", IEEE Journal of Quantum Electronics, vol. 29, No. 6, Jun. 1993.

M. Sagawa, et al, "High–Power Highly–Reliable Operation of 0.98– $\mu$m InGaAs–InGaP Strain–Compensated Single–Quantum–Well Lasers with Tensile–Strained InGaAsP Barriers", IEEE Journal of Selected Topics in Quantum Electronics, vol. 1, No. 2, Jun. 1995.

* cited by examiner

Primary Examiner—Paul Ip
Assistant Examiner—Jeffrey Zahn
(74) Attorney, Agent, or Firm—Sughrue Mion, PLLC

(57) ABSTRACT

In a semiconductor laser device: a lower cladding layer; a lower optical waveguide layer; a compressive strain quantum well active layer made of $In_{x3}Ga_{1-x3}As_{1-y3}P_{y3}$, where $0<x3\leq0.4$, $0\leq y3\leq0.1$; an upper optical waveguide layer; a first upper cladding layer made of $In_{x8}Ga_{1-x8}P$ of a second conductive type, and formed on the upper optical waveguide layer; an etching stop layer made of $In_{x1}Ga_{1-x1}As_{1-y1}P_{y1}$ of the second conductive type, where $0\leq x1\leq0.3$, $0\leq y1\leq0.3$; a current confinement layer made of $In_{x8}Ga_{1-x8}P$ of the first conductive type, where $x8=0.49\pm0.01$; a second upper cladding layer made of $Al_{z4}Ga_{1-z4}As$ of the second conductive type, where $0.20\leq z4\leq0.50$; and a contact layer of the second conductive type are formed on a GaAs substrate of a first conductive type in this order. In the semiconductor laser device, the absolute value of the product of the strain and the thickness of the compressive strain quantum well active layer is equal to or smaller than 0.25 nm; the absolute value of a second product of the strain and the thickness of the etching stop layer is equal to or smaller than 0.25 nm; and each of the lower cladding layer, the lower optical waveguide layer, the upper optical waveguide layer, the first upper cladding layer, the current confinement layer, the second upper cladding layer, and the contact layer has such a composition as to lattice-match with the GaAs substrate.

43 Claims, 14 Drawing Sheets

F I G. 10
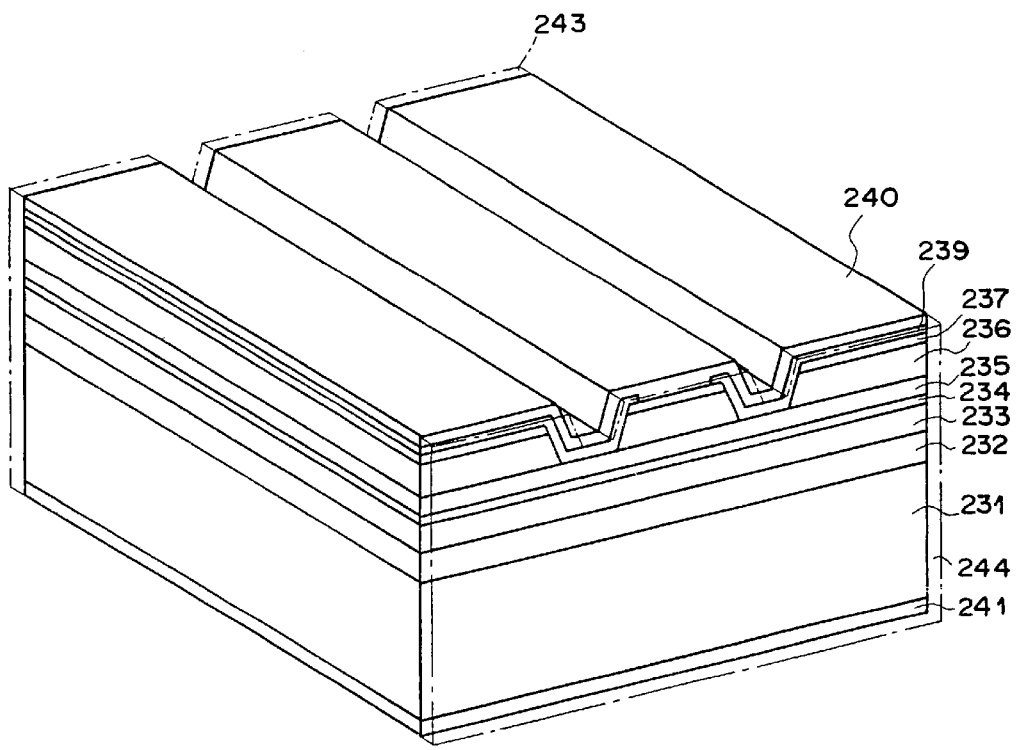

HIGH-POWER SEMICONDUCTOR LASER DEVICE HAVING CURRENT CONFINEMENT STRUCTURE AND INDEX-GUIDED STRUCTURE, AND OSCILLATING IN TRANSVERSE MODE

BACKGROUND OF THE INVENTION

1. Field of the Invention

The present invention relates to a semiconductor laser device having a current confinement structure and an index-guided structure. The present invention also relates to a process for producing a semiconductor laser device having a current confinement structure and an index-guided structure. Further, the present invention relates to a solid-state laser apparatus which includes as an excitation light source a semiconductor laser device having a current confinement structure and an index-guided structure. The solid-state laser apparatus may include provision for generating a second harmonic.

2. Description of the Related Art (1) In many conventional current semiconductor laser devices which emit light in the 0.9 to 1.1 $\mu$m band, a current confinement structure and an index-guided structure are provided in crystal layers which constitute the semiconductor laser devices so that each semiconductor laser device oscillates in a fundamental transverse mode. For example, IEEE Journal of Selected Topics in Quantum Electronics, vol. 1, No. 2, 1995, pp.102 discloses a semiconductor laser device which emits light in the 0.98 $\mu$m band. This semiconductor laser device is formed as follows.

On an n-type GaAs substrate, an n-type $Al_{0.48}Ga_{0.52}As$ lower cladding layer, an undoped $Al_{0.2}Ga_{0.8}As$ optical waveguide layer, an $Al_{0.2}Ga_{0.8}As/In_{0.2}Ga_{0.8}As$ double quantum well active layer, an undoped $Al_{0.2}Ga_{0.8}AS$ optical waveguide layer, a p-type AlGaAs first upper cladding layer, a p-type $Al_{0.67}Ga_{0.33}As$ etching stop layer, a p-type $Al_{0.48}Ga_{0.52}As$ second upper cladding layer, a p-type GaAs cap layer, and an insulation film are formed in this order. Next, a narrow-stripe ridge structure is formed above the p-type $Al_{0.67}Ga_{0.33}As$ etching stop layer by the conventional photolithography and selective etching, and an n-type $Al_{0.7}Ga_{0.3}As$ and n-type GaAs materials are embedded in both sides of the ridge structure by selective MOCVD using $Cl_2$ gas. Then, the insulation film is removed, and thereafter a p-type GaAs layer is formed. Thus, a current confinement structure and an index-guided structure are built in the semiconductor laser device.

However, the above semiconductor laser device has a drawback that it is very difficult to form the AlGaAs second upper cladding layer on the AlGaAs first upper cladding layer, since the AlGaAs first upper cladding layer contains a high Al content and is prone to oxidation, and selective growth of the AlGaAs second upper cladding layer is difficult.

(2) In addition, IEEE Journal of Selected Topics in Quantum Electronics, vol. 29, No. 6, 1993, pp.1936 discloses a semiconductor laser device which oscillates in a fundamental transverse mode, and emits light in the 0.98 to 1.02 $\mu$m band. This semiconductor laser device is formed as follows.

On an n-type GaAs substrate, an n-type $Al_{0.4}Ga_{0.6}As$ lower cladding layer, an undoped $Al_{0.2}Ga_{0.8}As$ optical waveguide layer, a GaAs/InGaAs double quantum well active layer, an undoped $Al_{0.2}Ga_{0.8}As$ optical waveguide layer, a p-type $Al_{0.4}Ga_{0.6}As$ upper cladding layer, a p-type GaAs cap layer, and an insulation film are formed in this order. Next, a narrow-stripe ridge structure is formed above a mid-thickness of the p-type $Al_{0.4}Ga_{0.6}As$ upper cladding layer by the conventional photolithography and selective etching, and an n-type $In_{0.5}Ga_{0.5}P$ material and an n-type GaAs material are embedded in both sides of the ridge structure by selective MOCVD. Finally, the insulation film is removed, and then electrodes are formed. Thus, a current confinement structure and an index-guided structure are realized in the layered construction.

However, the above semiconductor laser device also has a drawback that it is very difficult to form the InGaP layer on the AlGaAs upper cladding layer, since the AlGaAs upper cladding layer contains a high Al content and is prone to oxidation, and it is difficult to grow an InGaP layer having a different V-group component, on such an upper cladding layer.

(3) Further, IEEE Journal of Selected Topics in Quantum Electronics, vol. 1, No. 2, 1995, pp.189 discloses an all-layer-Al-free semiconductor laser device which oscillates in a fundamental transverse mode, and emits light in the 0.98 $\mu$m band. This semiconductor laser device is formed as follows.

On an n-type GaAs substrate, an n-type InGaP cladding layer, an undoped InGaAsP optical waveguide layer, an InGaAsP tensile strain barrier layer, an InGaAs double quantum well active layer, an InGaAsP tensile strain barrier layer, an undoped InGaAsP optical waveguide layer, a p-type InGaP first upper cladding layer, a p-type GaAs optical waveguide layer, a p-type InGaP second upper cladding layer, a p-type GaAs cap layer, and an insulation film are formed in this order. Next, a narrow-stripe ridge structure is formed above the p-type InGaP first upper cladding layer by the conventional photolithography and selective etching, and an n-type $In_{0.5}Ga_{0.5}P$ material is embedded in both sides of the ridge structure by selective MOCVD. Finally, the insulation film is removed, and a p-type GaAs contact layer is formed. Thus, a current confinement structure and an index-guided structure are realized.

The reliability of the above semiconductor laser device is improved since the strain in the active layer can be compensated for. However, the above semiconductor laser device also has a drawback that the kink level is low (about 150 mW) due to poor controllability of the ridge width.

As in the above example, the conventional current semiconductor laser devices which contain a current confinement structure, oscillate in a fundamental transverse mode, and emit light in the 0.9 to 1.1 $\mu$m band, are difficult to produce, or have poor characteristics, and are unreliable in high output power operation.

(4) High-power semiconductor laser devices having a broad light-emitting area are employed as excitation light sources in conventional solid-state laser apparatuses, in which output laser light is emitted from a solid-state laser crystal. In particular, some solid-state laser apparatuses further include a nonlinear crystal which converts a fundamental wave emitted from the solid-state laser crystal into a second harmonic, and such solid-state laser apparatuses are widely used.

In the above solid-state laser apparatuses, the semiconductor laser devices as excitation light sources are required to emit laser light with very high output power. In order to achieve the high output power, semiconductor laser devices in which an active layer has a width of 10 $\mu$m or greater are used, while the widths of the active layers in single-mode laser devices are usually about 3 μm. Therefore, a number of high-order transverse modes are mixed in oscillated light, and when the oscillation power is increased, the modes of oscillated light are liable to change to different modes due to spatial hole burning of carriers, which is caused by high density distribution of photons in the resonant cavity. At the same time, near-field pattern, far-field pattern, and oscillation spectrum vary. In addition, since efficiencies of current-to-light conversion are different between different transverse modes, the optical output power further varies. This phenomenon is called a kink in the current-optical output power characteristic of a semiconductor laser device.

Thus, the following problems arise.

When the above high-power semiconductor laser device is used as an excitation light source in a solid-state laser apparatus, at least one component coupled with an oscillation mode of the solid-state laser resonator is utilized as an excitation light from among oscillated light generated by the semiconductor laser device and condensed by a lens system into a solid-state laser crystal. Therefore, the output intensity varies greatly with changes of the transverse modes. In addition, since the absorption spectrum of the solid-state laser crystal has a fine absorption spectrum structure in a narrow wavelength band, an amount of absorbed light varies in response to the variation of an oscillation spectrum. Thus, the output intensity of the solid-state laser apparatus is further affected by variation of the oscillation spectrum, as well as change of the transverse modes. Furthermore, use of a spatial or spectral portion of the light generated by the solid-state laser device increases high-frequency noise accompanying by switching between the transverse modes.

As mentioned above, when transverse modes or longitudinal modes in a semiconductor laser device used as an excitation light source in a solid-state laser apparatus change, i.e., when an oscillation spectrum of the semiconductor laser device varies, the excitation efficiency in the solid-state laser apparatus varies, and therefore the optical output also varies. At the same time, high frequency noise is generated. Further, in practice, in order to vary the light intensity of the solid-state laser apparatus, or achieve phase matching with a wavelength conversion element, temperature and excitation current must be varied. Therefore, when oscillation modes change at the same time as the variations of the temperature and the excitation current, the intensity of the output laser light varies strikingly. Although the above variation of the intensity of the output laser light is a variation in the intensity of a DC component of the output laser light, it is probable that AC noise is continuously produced.

Generally, the intensity and the frequency spectrum of the output laser light of the solid-state laser apparatus depend on the intensity and the spectrum component of the excitation laser light which is emitted from the semiconductor laser device, and actually used for excitation of the solid-state laser crystal. In addition, the intensity and the frequency spectrum of the output laser light of the solid-state laser apparatus also vary with the excitation current and an individual difference in the characteristics of the semiconductor laser device. Thus, the intensity and the frequency spectrum of the output laser light of the solid-state laser apparatus are not uniform. The variation in the intensity of the DC laser light sometimes exceeds 10%, and therefore causes problems in various applications. In particular, in order to generate a high quality image, it is desirable that a noise level is 1% or lower. However, it is impossible to repetitively achieve or maintain the noise level of 1% or lower in the conventional high-power semiconductor laser devices which have an ordinary oscillation region. In addition, when a solid-state laser apparatus and a nonlinear crystal are combined in order to generate a second harmonic, the above noise is amplified by the nonlinear effect, and it is therefore necessary to further suppress the noise.

Japanese Unexamined Patent Publication, No.11(1999)-74620, which is assigned to the present assignee, discloses that reduction of a strain imposed on the semiconductor laser device by a so-called junction-up type mounting of the semiconductor laser device on a heat sink, as well as prevention of change of the transverse modes by using an index-guided semiconductor laser device, is effective at suppressing noise. However, it is difficult to increase an output power of a semiconductor laser device which is mounted on a heat sink in a junction-up configuration. In addition, photon density in an active layer must be suppressed in order to increase reliability, and the width of the optical waveguide layers must be made broad in order to suppress the photon density in an active layer. However, it is impossible to form an index-guided structure when the optical waveguide layers are broad.

As mentioned before, the conventional high-power semiconductor laser devices having a broad light-emitting region lack optical stability. That is, the optical output of the conventional high-power semiconductor laser devices having a broad light-emitting region is unstable, and the noise level in the optical output is not sufficiently low. Therefore, it is not desirable to use solid-state laser apparatuses using the conventional high-power semiconductor laser device as an excitation light source, as well as optical fiber laser apparatuses in which the conventional high-power semiconductor laser device is coupled to an optical fiber, in the applications for producing high quality images such as printed images, photographs, and medical images.

SUMMARY OF THE INVENTION

An object of the present invention is to provide a reliable semiconductor laser device which can oscillate in a fundamental transverse mode even when output power is high.

Another object of the present invention is to provide a process for producing a reliable semiconductor laser device which can oscillate in a fundamental transverse mode even when output power is high.

Still another object of the present invention is to provide a stripe-type index-guided semiconductor laser device which oscillates in multiple transverse modes, and has a stable optical output with low noise.

A further object of the present invention is to provide a process for producing a stripe-type index-guided semiconductor laser device which oscillates in multiple transverse modes, and has a stable optical output with low noise.

(1) According to the first aspect of the present invention, there is provided a semiconductor laser device including: a GaAs substrate of a first conductive type; a lower cladding layer of the first conductive type, formed on the GaAs substrate; a lower optical waveguide layer formed on the lower cladding layer; a compressive strain quantum well active layer made of $In_{x3}Ga_{1-x3}As_{1-y3}P_{y3}$ and formed on the lower optical waveguide layer, where $0<x3\leq0.4$, $0\leq y3\leq0.1$, and an absolute value of a first product of a strain and a thickness of the compressive strain quantum well active layer is equal to or smaller than 0.25 nm; an upper optical waveguide layer formed on the compressive strain quantum well active layer; a first upper cladding layer made of $In_{x8}Ga_{1-x8}P$ of a second conductive type, and formed on the upper optical waveguide layer; an etching stop layer made of $In_{x1}Ga_{1-x1}As_{1-y1}P_{y1}$ of the second conductive type, and formed on the first upper cladding layer other than a stripe area of the first upper cladding layer so as to form a first portion of a stripe groove realizing a current injection window, where $0 \leq x1 \leq 0.3$, $0y1 \leq 0.3$, and an absolute value of a second product of a strain and a thickness of the etching stop layer is equal to or smaller than 0.25 nm; a current confinement layer made of $In_{x8}Ga_{1-x8}P$ of the first conductive type, and formed on the etching stop layer so as to form a second portion of the stripe groove, where $x8=0.49\pm0.01$; a second upper cladding layer made of $Al_{z4}Ga_{1-z4}As$ of the second conductive type, and formed over the current confinement layer and the stripe area of the first upper cladding layer so as to cover the stripe groove, where $0.20 \leq z4 \leq 0.50$; and a contact layer of the second conductive type, formed on the second upper cladding layer. In the semiconductor laser device, each of the lower cladding layer, the lower optical waveguide layer, the upper optical waveguide layer, the first upper cladding layer, the current confinement layer, the second upper cladding layer, and the contact layer has such a composition as to lattice-match with the GaAs substrate.

The first and second conductive types are opposite to each other in carrier polarity. For example, when the first conductive type is n type, the second conductive type is p type. In addition, the undoped type semiconductor is doped with substantially no impurity.

The strain $\Delta a$ of the quantum well active layer is defined as $\Delta a=(ca-cs)/cs$, where cs and ca are the lattice constants of the GaAs substrate and the quantum well active layer, respectively, and the strain $\Delta e$ of the etching stop layer is defined as $\Delta e=(ce-cs)/cs$, where ce is the lattice constant of the etching stop layer. That is, in the semiconductor laser device according to the first aspect of the present invention, $-0.25$ nm $\leq \Delta a \cdot da \leq 0.25$ nm, and $-0.25$ nm $\leq \Delta e \cdot de \leq 0.25$ nm, where da and de are the thicknesses of the quantum well active layer and the etching stop layer, respectively. In the first to fourth aspects of the present invention, when a layer grown over the substrate has a lattice constant c, and an absolute value of the amount $(c-cs)/cs$ is equal to or smaller than 0.003, the layer is lattice-matched with the substrate.

Preferably, the semiconductor laser device according to the first aspect of the present invention may also have one or any possible combination of the following additional features (i) to (iii).

(i) The semiconductor laser device may further include first and second tensile strain barrier layers both made of $In_{x5}Ga_{1-x5}As_{1-y5}P_{y5}$, and respectively formed above and below the compressive strain quantum well active layer, where $0 \leq x5 \leq 0.3$ and $0 \leq y5 \leq 0.6$, and an absolute value of a sum of the first product and a third product of a strain of the first and second tensile strain barrier layers and a total thickness of the first and second tensile strain barrier layers is equal to or smaller than 0.25 nm.

The strain $\Delta b$ of the first and second tensile strain barrier layers is defined as $\Delta b=(cb-cs)/cs$, where cb is the lattice constant of the first and second tensile strain barrier layers, and cs is the lattice constant of the substrate. That is, in this semiconductor laser device, $-0.25$ nm $\leq \Delta a \cdot da + \Delta b \cdot db \leq 0.25$ nm, where db is the total thickness of the first and second tensile strain barrier layers.

(ii) The semiconductor laser device may further include an additional layer being made of $In_{x8}Ga_{1-x8}P$ of the second conductive type, formed below the second upper cladding layer, and having a thickness between 10 to 400 nm, where $x8=0.49\pm0.01$. In particular, the optimum thickness of the $In_{x8}Ga_{1-x8}P$ layer is 250 to 300 nm.

(iii) The stripe groove may have a width equal to or greater than 1 μm.

(2) According to the second aspect of the present invention, there is provided a semiconductor laser device including: a GaAs substrate of a first conductive type; a lower cladding layer of the first conductive type, formed on the GaAs substrate; a lower optical waveguide layer formed on the lower cladding layer; a compressive strain quantum well active layer made of $In_{x3}Ga_{1-x3}As_{1-y3}P_{y3}$, and formed on the lower optical waveguide layer, where $0 \leq x3 \leq 0.4$, and $0 \leq y3 \leq 0.1$, and an absolute value of a first product of a strain and a thickness of the compressive strain quantum well active layer is equal to or smaller than 0.25 nm; an upper optical waveguide layer formed on the compressive strain quantum well active layer; a first upper cladding layer of a second conductive type, formed on the upper optical waveguide layer; a first etching stop layer made of $In_{x7}Ga_{1-x7}P$ of the second conductive type, and formed on the first upper cladding layer, where $0 \leq x7 \leq 1$; a second etching stop layer made of $In_{x1}Ga_{1-x1}As_{1-y1}P_{y1}$ of the second conductive type, and formed on the first etching stop layer other than a stripe area of the first etching stop layer so as to form a first portion of a stripe groove realizing a current injection window, where $0 \leq x1 \leq 0.3$, and $0 \leq y1 \leq 0.3$; a current confinement layer made of $In_{x8}Ga_{1-x8}P$ of the first conductive type, and formed on the second etching stop layer so as to form a second portion of the stripe groove, where $x8=0.49\pm0.01$; a second upper cladding layer made of $Al_{z4}Ga_{1-z4}As$ of the second conductive type, and formed over the current confinement layer and the stripe area of the first upper cladding layer so as to cover the stripe groove, where $0.20 \leq z4 \leq 0.50$; and a contact layer of the second conductive type, formed on the second upper cladding layer. In the semiconductor laser device, each of the lower cladding layer, the lower optical waveguide layer, the upper optical waveguide layer, the first upper cladding layer, the current confinement layer, the second upper cladding layer, and the contact layer has such a composition as to lattice-match with the GaAs substrate, and an absolute value of a sum of a second product of a strain and a thickness of the first etching stop layer and a third product of a strain and a thickness of the second etching stop layer is equal to or smaller than 0.25 nm. That is, in the semiconductor laser device according to the second aspect of the present invention, $-0.25$ nm $\leq \Delta e1 \cdot de1 + \Delta e2 \cdot de2 \leq 0.25$ nm, where $\Delta e1$ and $\Delta e2$ are strains of the first and second etching stop layers, respectively, and de1 and de2 are the thicknesses of the first and second etching stop layers, respectively.

Preferably, the semiconductor laser device according to the second aspect of the present invention may also have one or any possible combination of the aforementioned additional features (ii) and (iii) and the following additional features (iv) and (v).

(iv) The semiconductor laser device may further include first and second tensile strain barrier layers both made of $In_{x5}Ga_{1-x5}As_{1-y5}P_{y5}$, and respectively formed above and below the compressive strain quantum well active layer, where $0 \leq x5 \leq 0.3$ and $0 < y5 \leq 0.6$, and an absolute value of a sum of the first product and a fourth product of a strain of the first and second tensile strain barrier layers and a total thickness of the first and second tensile strain barrier layers is equal to or smaller than 0.25 nm.

(v) The first upper cladding layer is made of $In_{x6}Ga_{1-x6}As_{1-y6}P_{6y}$ or $Al_{z5}Ga_{1-z5}As$, where $x6=(0.49\pm0.01)y6$, $0.2<y6<1$, and $0.25 \leq z5 \leq 0.7$.

(3) According to the third aspect of the present invention, there is provided a process for producing a semiconductor laser device, comprising the steps of: (a) forming a lower cladding layer of a first conductive type, on a GaAs substrate of the first conductive type; (b) forming a lower optical waveguide layer on the lower cladding layer; (c) forming a compressive strain quantum well active layer made of $In_{x3}Ga_{1-x3}As_{1-y3}P_{y3}$, on the lower optical waveguide layer, where $0<x3\leq0.4, 0\leq y3\leq0.1$, and an absolute value of a first product of a strain and a thickness of the compressive strain quantum well active layer is equal to or smaller than 0.25 nm; (d) forming an upper optical waveguide layer on the compressive strain quantum well active layer; (e) forming a first upper cladding layer made of $In_{x8}Ga_{1-x8}P$ of a second conductive type, on the upper optical waveguide layer; (f) forming an etching stop layer made of $In_{x1}Ga_{1-x1}As_{1-y1}P_{y1}$ of the second conductive type, on the first upper cladding layer, where $0\leq x1\leq0.3, 0\leq y1\leq0.3$, and an absolute value of a second product of a strain and a thickness of the etching stop layer is equal to or smaller than 0.25 nm; (g) forming a current confinement layer made of $In_{x8}Ga_{1-x8}P$ of the first conductive type, on the etching stop layer, where $x8=0.49\pm0.01$; (h) removing a stripe area of the current confinement layer so as to form a first portion of a stripe groove for realizing a current injection window; (i) removing a stripe area of the etching stop layer so as to form a second portion of the stripe groove; (j) forming a second upper cladding layer made of $Al_{z4}Ga_{1-z4}As$ of the second conductive type so that the stripe groove is covered with the second upper cladding layer, where $0.20\leq z4\leq0.50$; and (k) forming a contact layer of the second conductive type, on the second upper cladding layer. In the process, each of the lower cladding layer, the lower optical waveguide layer, the upper optical waveguide layer, the first upper cladding layer, the current confinement layer, the second upper cladding layer, and the contact layer has such a composition as to lattice-match with the GaAs substrate.

That is, the semiconductor laser device according to the first aspect of the present invention can be produced by the process according to the third aspect of the present invention.

Preferably, the process according to the third aspect of the present invention may also have one or any possible combination of the following additional features (vi) to (viii).

(vi) The process according to the third aspect of the present invention may further comprise the steps of (b1) forming, after the step (b), a first tensile strain barrier layer made of $In_{x5}Ga_{1-x5}As_{1-y5}P_{y5}$, on the lower optical waveguide layer, where $0\leq x5\leq0.3$ and $0<y5\leq0.6$, and (c1) forming, after the step (c), a second tensile strain barrier layer made of $In_{x5}Ga_{1-x5}As_{1-y5}P_{y5}$, on the compressive strain quantum well active layer, where an absolute value of a sum of the first product and a third product of a strain of the first and second tensile strain barrier layers and a total thickness of the first and second tensile strain barrier layers is equal to or smaller than 0.25 nm.

(vii) The process according to the third aspect of the present invention may further comprise the step of (j1) forming, before the step (j), an additional layer having a thickness of 10 to 400 nm and being made of $In_{x8}Ga_{1-x8}P$ of the second conductive type on the current confinement layer so that the stripe groove is covered with the additional layer, where $x8=0.49\pm0.01$. In particular, it is preferable that the thickness of the $In_{x8}Ga_{1-x8}P$ layer is 250 to 300 nm.

(viii) The process according to the third aspect of the present invention may further comprise, after the step (g), the steps of (g1) forming a cap layer made of GaAs, and (g2) removing a stripe area of the cap layer. In addition, in the step (i), a remaining area of the cap layer is also removed.

The above cap layer may be one of the first and second conductive types and the undoped type.

(4) According to the fourth aspect of the present invention, there is provided a process for producing a semiconductor laser device, comprising the steps of: (a) forming a lower cladding layer of a first conductive type on a GaAs substrate of the first conductive type; (b) forming a lower optical waveguide layer on the lower cladding layer; (c) forming a compressive strain quantum well active layer made of $In_{x3}Ga_{1-x3}As_{1-y3}P_{y3}$ on the lower optical waveguide layer, where $0<x3\leq0.4$, and $0\leq y3\leq0.1$, and an absolute value of a first product of a strain and a thickness of the compressive strain quantum well active layer is equal to or smaller than 0.25 nm; (d) forming an upper optical waveguide layer on the compressive strain quantum well active layer; (e) forming a first upper cladding layer of a second conductive type, on the upper optical waveguide layer; (f) forming a first etching stop layer made of $In_{x7}Ga_{1-x7}P$ of the second conductive type, on the first upper cladding layer, where $0\leq x7\leq1$; (g) forming a second etching stop layer made of $In_{x1}Ga_{1-x1}As_{1-y1}P_{y1}$ of the second conductive type, on the first etching stop layer, where $0\leq x1\leq0.3$, and $0\leq y1\leq0.3$; (h) forming a current confinement layer made of $In_{x8}Ga_{1-x8}P$ of the first conductive type, on the second etching stop layer, where $x8=0.49\pm0.01$; (i) removing a stripe area of the current confinement layer so as to form a first portion of a stripe groove for realizing a current injection window; (j) removing a stripe area of the second etching stop layer so as to form a second portion of the stripe groove; (k) forming a second upper cladding layer made of $Al_{z4}Ga_{1-z4}As$ of the second conductive type so that the stripe groove is covered with the second upper cladding layer, where $0.20\leq z4\leq0.50$; and (l) forming a contact layer of the second conductive type, on the second upper cladding layer. In the process, each of the lower cladding layer, the lower optical waveguide layer, the upper optical waveguide layer, the first upper cladding layer, the current confinement layer, the second upper cladding layer, and the contact layer has such a composition as to lattice-match with the GaAs substrate, and an absolute value of a sum of a second product of a strain and a thickness of the first etching stop layer and a third product of a strain and a thickness of the second etching stop layer is equal to or smaller than 0.25 nm.

That is, the semiconductor laser device according to the second aspect of the present invention can be produced by the process according to the fourth aspect of the present invention.

Preferably, the process according to the fourth aspect of the present invention may also have one or any possible combination of the aforementioned additional feature (vi) and the following additional features (ix) and (x).

(ix) The process according to the fourth aspect of the present invention may further comprise the step of (k1) forming, before the step (k), an additional layer having a thickness of 10 to 400 nm and being made of $In_{x8}Ga_{1-x8}P$ of the second conductive type on the current confinement layer so that the stripe groove is covered with the additional layer, where $x8=0.49\pm0.01$. In particular, it is preferable that the thickness of the $In_{x8}Ga_{1-x8}P$ layer is 250 to 300 nm.

(x) The process according to the fourth aspect of the present invention may further comprise the steps of (h1) forming a cap layer made of GaAs on the current confinement layer, and (h2) removing a stripe area of the cap layer.

In addition, in the step (j), a remaining area of the cap layer is also removed.

The above cap layer may be one of the first and second conductive types and the undoped type.

(5) The first to fourth aspects of the present invention have the following advantages.

(a) In the semiconductor laser devices according to the first and second aspects of the present invention, the current confinement layer is made of $In_{x8}Ga_{1-x8}P$, and the second upper cladding layer is made of $Al_{z4}Ga_{1-z4}As$. Therefore, the difference in the refractive indexes between the current confinement layer and the second upper cladding layer realizes, with high accuracy, a difference of about $1.5 \times 10^{-3}$ to $1 \times 10^{-2}$ in the equivalent refractive index between a portion of the active region under the stripe groove and the other portions of the active region under the current confinement layer, and it is possible to cut off oscillation in higher modes. Thus, oscillation in a fundamental transverse mode can be maintained even when the output power becomes high.

(b) When a base layer on which the second upper cladding layer is formed contains aluminum, the base layer is prone to oxidation, and it is difficult to realize desired characteristics in the semiconductor laser device. However, in the semiconductor laser devices according to the first and second aspects of the present invention, the $In_{x8}Ga_{1-x8}P$ first upper cladding layer, the $In_{x7}Ga_{1-x7}P$ first etching stop layer, and the $In_{x8}Ga_{1-x8}P$ current confinement layer, which can be a base layer of the second upper cladding layer, do not contain aluminum. Therefore, it is easy to form the second upper cladding layer. In addition, since a crystal defect due to oxidation of aluminum does not occur, the characteristics of the semiconductor laser device do not deteriorate, and reliability is improved.

(c) Since the current confinement layer is arranged within the semiconductor laser device, it is possible to increase the contact area between the electrode and the contact layer. Therefore, the contact resistance can be reduced.

(d) Due to the provision of the current confinement layer, the currents can be confined within a small width during current injection into the active region. Therefore, the transverse mode oscillation is less prone to cause a kink in a current-optical output characteristic. That is, the kink level can be raised.

(e) Since the etching stop layer is made of InGaAsP, the stripe width can be accurately adjusted by wet etching in which the difference in the etching rate between the etching stop layer and the InGaP current confinement layer is utilized.

(f) When the InGaP layer having a thickness of 10 to 400 nm is formed before the second upper cladding layer is formed, it is possible to increase the control range of the Al composition in the $Al_{z4}Ga_{1-z4}As$ second upper cladding layer.

(g) When the $In_{x5}Ga_{1-x5}As_{1-y5}P_{y5}$ tensile strain barrier layers ($0 \leq x5 \leq 0.3$ and $0 < y5 \leq 0.6$) are respectively formed above and below the compressive strain quantum well active layer, various characteristics are improved (e.g., the threshold current is lowered), and reliability is increased.

(h) When the stripe width is equal to or greater than 1 µm, the semiconductor laser devices according to the first and second aspects of present invention are most advantageous since the semiconductor laser devices can oscillate with high output power and low noise, even in multiple modes.

(i) When a GaAs cap layer is formed on the InGaP current confinement layer, it is possible to prevent formation of a natural oxidation film on the InGaP current confinement layer, as well as metamorphic change in the InGaP current confinement layer, which occurs when a resist layer is formed directly on the InGaP current confinement layer. In addition, since the GaAs cap layer is removed before the second upper optical waveguide layer is formed, it is possible to remove a residue left on the base layer on which the second upper optical waveguide layer is formed, and prevent the occurrence of crystal defects.

(6) According to the fifth aspect of the present invention, there is provided a semiconductor laser device comprising: a GaAs substrate of a first conductive type; a lower cladding layer of the first conductive type, formed on the GaAs substrate; a lower optical waveguide layer of an undoped type or the first conductive type, formed on the lower cladding layer; an active layer formed on the lower optical waveguide layer; a first upper optical waveguide layer of an undoped type or a second conductive type, formed on the active layer; an etching stop layer made of $In_{x1}Ga_{1-x1}As_{1-y1}P_{y1}$ of the second conductive type, and formed on the first upper optical waveguide layer other than a stripe area of the first upper optical waveguide layer so as to form a first portion of a stripe groove realizing a current injection window, where $0 \leq x1 \leq 0.5$, and $0 \leq y1 \leq 0.8$; a current confinement layer made of $In_{x3}(Al_{z3}Ga_{1-z3})_{1-x3}P$ of the first conductive type, and formed on the etching stop layer so as to form a second portion of the stripe groove, where $0 < z3 \leq 1$, and $x3 = 0.49 \pm 0.01$; a second upper optical waveguide layer of the second conductive type, formed over the current confinement layer and the stripe area of the first upper optical waveguide layer so as to cover the stripe groove; an upper cladding layer of the second conductive type, and formed on the second upper optical waveguide layer; and a contact layer made of GaAs of the second conductive type, and formed on the upper cladding layer. In the semiconductor laser device, a total thickness of the lower optical waveguide layer and the first and second upper optical waveguide layers is equal to or greater than 0.6 µm, and the active layer is made of one of InGaAs, InGaAsP, and GaAsP.

Preferably, the semiconductor laser device according to the fifth aspect of the present invention may also have one or any possible combination of the following additional features (xi) and (xvii).

(xi) The process according to the fifth aspect of the present invention may further comprise a cap layer made of $In_{0.49}Ga_{0.51}P$ of the first or second conductive type, and formed between the current confinement layer and the second upper optical waveguide layer.

(xii) Each of the lower optical waveguide layer and the first and second upper optical waveguide layers is made of $In_{x2}Ga_{1-x2}P$, where $x2 = 0.49 \pm 0.01$.

(xiii) Each of the lower optical waveguide layer and the first and second upper optical waveguide layers is made of $In_{x2}Ga_{1-x2}As_{y2}P_{1-y2}$, where $x2 = (0.49 \pm 0.01)y2$, and $0 \leq x2 \leq 0.49$.

(xiv) The semiconductor laser device according to the fifth or sixth aspect of the present invention further comprises first and second tensile strain barrier layers made of one of InGaP, InGaAsP, and GaAsP, and respectively formed above and below the active layer.

(xv) Each of the lower and upper cladding layers is made of one of AlGaAs, InGaAlP, and InGaAlPAs which lattice-match with the GaAs substrate.

In the fifth to tenth aspects of the present invention, when a layer grown over the substrate has a lattice constant c, and an absolute value of the amount (c−cs)/cs is equal to or smaller than 0.003, the layer is lattice-matched with the substrate, where cs is the lattice constant of the GaAs substrate.

(xvi) The bottom of the stripe groove has a width of 1 to 5 μm, and a difference in an equivalent refractive index caused by a difference in a refractive index between the current confinement layer and the second upper optical waveguide layer is in a range from 0.0015 to 0.01.

The difference in the equivalent refractive index is a difference in the equivalent refractive index in propagation modes in the thickness direction, between portions of the active region under the current confinement layer and the other portion of the active region under the stripe groove.

(xvii) The bottom of the stripe groove has a width equal to or greater than 10 μm.

(7) According to the sixth aspect of the present invention, there is provided a semiconductor laser device comprising: a GaAs substrate of a first conductive type; a lower cladding layer of the first conductive type, formed on the GaAs substrate; a lower optical waveguide layer of an undoped type or the first conductive type, formed on the lower cladding layer; an active layer formed on the lower optical waveguide layer; a first upper optical waveguide layer of an undoped type or a second conductive type, formed on the active layer; a first etching stop layer made of $In_{x9}Ga_{1-x9}P$ of the second conductive type, and formed on the first upper optical waveguide layer, where $0 \leq x9 \leq 1$; a second etching stop layer made of $In_{x1}Ga_{1-x1}As_{1-y1}P_{y1}$ of the second conductive type, and formed on the first etching stop layer other than a stripe area of the first etching stop layer so as to form a first portion of a stripe groove realizing a current injection window, where $0 \leq x1 \leq 0.5$, and $0 \leq y1 \leq 0.8$; a current confinement layer made of $In_{x3}(Al_{z3}Ga_{1-z3})_{1-x3}P$ of the first conductive type, and formed on the second etching stop layer so as to form a second portion of the stripe groove, where $0 < z3 \leq 1$, and $x3 = 0.49 \pm 0.01$; a second upper optical waveguide layer of the second conductive type, formed over the current confinement layer and the stripe area of the first etching stop layer so as to cover the stripe groove; an upper cladding layer of the second conductive type, and formed on the second upper optical waveguide layer; and a contact layer made of GaAs of the second conductive type, and formed on the upper cladding layer. In the semiconductor laser device, a total thickness of the lower optical waveguide layer and the first and second upper optical waveguide layers is equal to or greater than 0.6 μm, and the active layer is made of one of InGaAs, InGaAsP, and GaAsP.

Preferably, the semiconductor laser device according to the sixth aspect of the present invention may also have one or any possible combination of the aforementioned additional features (xi) and (xvii).

(8) According to the seventh aspect of the present invention, there is provided a process for producing a semiconductor laser device, comprising the steps of: (a) forming a lower cladding layer of a first conductive type, on a GaAs substrate of the first conductive type; (b) forming a lower optical waveguide layer of an undoped type or the first conductive type, on the lower cladding layer; (c) forming an active layer on the lower optical waveguide layer; (d) forming a first upper optical waveguide layer of an undoped type or a second conductive type, on the active layer; (e) forming an etching stop layer made of $In_{x1}Ga_{1-x1}As_{1-y1}P_{y1}$ of the second conductive type, on the first upper optical waveguide layer, where $0 \leq x1 \leq 0.5$, and $0 \leq y1 \leq 0.8$; (f) forming a current confinement layer made of $In_{x3}(Al_{z3}Ga_{1-z3})_{1-x3}P$ of the first conductive type, on the etching stop layer, where $0 < z3 \leq 1$, and $x3 = 0.49 \pm 0.01$, (g) removing a stripe area of the current confinement layer so as to form a first portion of a stripe groove for realizing a current injection window; (h) removing a stripe area of the etching stop layer so as to form a second portion of the stripe groove; (i) forming a second upper optical waveguide layer of the second conductive type so that the stripe groove is covered with the second upper optical waveguide layer; (j) forming an upper cladding layer of the second conductive type, on the second upper optical waveguide layer; and (k) forming a contact layer made of GaAs of the second conductive type, on the upper cladding layer. In the process, a total thickness of the lower optical waveguide layer and the first and second upper optical waveguide layers is equal to or greater than 0.6 μm, and the active layer is made of one of InGaAs, InGaAsP, and GaAsP.

That is, the semiconductor laser device according to the fifth aspect of the present invention can be produced by the process according to the seventh aspect of the present invention.

Preferably, the process according to the seventh aspect of the present invention may also have one or any possible combination of the following features (xviii) and (xix).

(xviii) The process according to the seventh aspect of the present invention may further comprise the steps of (b1) forming, after the step (b), a first tensile strain barrier layer made of one of InGaP, InGaAsP, and GaAsP, on the lower optical waveguide layer, and (c1) forming, after the step (c), a second tensile strain barrier layer made of one of InGaP, InGaAsP, and GaAsP, on the active layer.

(xix) The process according to the seventh aspect of the present invention may further comprise, after the step (f), the steps of (f1) forming a cap layer made of $In_{0.49}Ga_{0.51}P$ of the first or second conductive type, and (f2) removing a stripe area of the cap layer. In addition, in the step (h), a remaining area of the cap layer is also removed.

(9) According to the eighth aspect of the present invention, there is provided a process for producing a semiconductor laser device, comprising the steps of: (a) forming a lower cladding layer of a first conductive type, on a GaAs substrate of the first conductive type; (b) forming a lower optical waveguide layer of an undoped type or the first conductive type, on the lower cladding layer; (c) forming an active layer on the lower optical waveguide layer; (d) forming a first upper optical waveguide layer of an undoped type or a second conductive type, on the active layer; (e) forming a first etching stop layer made of $In_{x9}Ga_{1-x9}P$ of the second conductive type, on the first upper optical waveguide layer, where $0 \leq x9 \leq 1$; (f) forming a second etching stop layer made of $In_{x1}Ga_{1-x1}As_{1-y1}P_{y1}$ of the second conductive type, on the first etching stop layer, where $0 \leq x1 \leq 0.5$, and $0 \leq y1 \leq 0.8$; (g) forming a current confinement layer made of $In_{x3}(Al_{z3}Ga_{1-z3})_{1-x3}P$ of the first conductive type, on the second etching stop layer, where $0 < z3 \leq 1$, and $x3 = 0.49 \pm 0.01$; (h) removing a stripe area of the current confinement layer so as to form a first portion of a stripe groove for realizing a current injection window; (i) removing a stripe area of the second etching stop layer so as to form a second portion of the stripe groove; (j) forming a second upper optical waveguide layer of the second conductive type so that the stripe groove is covered with the second upper optical waveguide layer; (k) forming an upper cladding layer of the second conductive type, on the second upper optical waveguide layer; and (l) forming a contact layer made of GaAs of the second conductive type, on the upper cladding layer. In the process, a total thickness of the lower optical waveguide layer and the first and second upper optical waveguide layers is equal to or greater than 0.6 µm, and the active layer is made of one of InGaAs, InGaAsP, and GaAsP.

That is, the semiconductor laser device according to the sixth aspect of the present invention can be produced by the process according to the eighth aspect of the present invention.

Preferably, the process according to the eighth aspect of the present invention may also have one or any possible combination of the aforementioned feature (xviii) and the following feature (xx).

(xx) The process according to the eighth aspect of the present invention may further comprise, after the step (g), the steps of (g1) forming a cap layer made of $In_{0.49}Ga_{0.51}P$ of the first or second conductive type, and (g2) removing a stripe area of the cap layer. In addition, in the step (i), a remaining area of the cap layer is also removed.

(10) According to the ninth aspect of the present invention, there is provided a solid-state laser apparatus having as an exciting light source the semiconductor laser device according to the fifth aspect of the present invention.

Preferably, the solid-state laser apparatus according to the ninth aspect of the present invention may also have one or any possible combination of the following additional feature (xxi) and the aforementioned additional features (xi) to (xvii).

(xxi) The solid-state laser apparatus according to the ninth aspect of the present invention may further comprise a solid-state laser crystal which is excited with first laser light emitted from the excitation light source, and emits second laser light, and a wavelength conversion crystal which converts the second laser light into a second harmonic.

(11) According to the tenth aspect of the present invention, there is provided a solid-state laser apparatus having as an exciting light source the semiconductor laser device according to the sixth aspect of the present invention.

Preferably, the solid-state laser apparatus according to the tenth aspect of the present invention may also have one or any possible combination of the aforementioned additional features (xi) to (xvii), and (xxi).

(12) The fifth to tenth aspects of the present invention have the following advantages.

(a) Since the current confinement structure is formed, the strain caused by the junction-down type mounting can be reduced, and the fluctuation in the transverse modes during oscillation can be suppressed. Thus, the variation in the optical output of the solid-state laser apparatus can be suppressed. In addition, when the junction-down type mounting is employed, the heat dissipation characteristics of the semiconductor laser device are improved. Therefore, the amount of variation in the wavelength, which is caused by increase in a driving current, can be reduced. Thus, it is possible to realize a solid-state laser apparatus which is highly reliable for a long time.

(b) In the semiconductor laser devices according to the fifth and sixth aspects of the present invention, the active layers do not contain aluminum. Therefore, the semiconductor laser devices are free from deterioration caused by oxidation of aluminum, and the semiconductor laser devices are reliable even when the semiconductor laser devices operate with high output power.

(c) In the semiconductor laser devices according to the fifth and sixth aspects of the present invention, the current confinement layer is made of $In_{x3}(Al_{z3}Ga_{1-z3})_{1-x3}P$. Therefore, when the second upper optical waveguide layer is made of InGaP or InGaAsP, the difference in the refractive indexes between the current confinement layer and the second upper cladding layer realizes a difference of about $1.5\times10^{-3}$ to $1\times10^{-2}$ in the equivalent refractive index between the portion of the active region under the stripe groove and the other portions of the active region under the current confinement layer. In particular, when the width of the oscillation region is narrow, e.g., 1 µm to 5 µm, and the difference in the equivalent refractive index is too great, the transverse modes become unstable. However, when the difference in the equivalent refractive index is about $1.5\times10^{-3}$ to $1\times10^{-2}$, the semiconductor laser devices can operate in a basic transverse mode even when the output power is high, and the instability of the transverse mode due to occurrence of higher modes can be prevented.

(d) Since the current confinement layer is arranged within the semiconductor laser device, it is possible to increase the contact area between the electrode and the contact layer. Therefore, the contact resistance can be reduced, and it is possible to operate the semiconductor laser devices with high output power.

(e) In order to prevent deterioration of a light-emitting end surface caused by high photon density in a high-power semiconductor laser device, it is effective to increase a thickness of an optical waveguide layer so as to reduce a peak photon density in an active layer. However, in conventional semiconductor laser devices having a current confinement structure and an index-guided structure, the thickness of the optical waveguide layer located between the active layer and the current confinement layer is limited since the distance between the active layer and the current confinement layer cannot be increased in order to realize a basic transverse mode by the effect of the index-guided structure. According to the fifth to tenth aspects of the present invention, the second upper optical waveguide layer is arranged over the current confinement layer, and the total thickness of the lower optical waveguide layer and the first and second upper optical waveguide layers is equal to or greater than 0.6 µm. Therefore, it is possible to substantially increase the thickness of the optical waveguide layer, and reduce the peak photon density in the active layer. In addition, it is possible to prevent the temperature rise at a light-emitting end surface caused by increase in non-emission currents, and therefore deterioration of the light-emitting end surface due to high photon density can be prevented, thus increasing reliability in a high power operation.

(f) In the sixth, eighth, and tenth aspects of the present invention, the first etching stop layer is made of InGaP, and the second etching stop layer made of InGaAsP is arranged over the first etching stop layer. Therefore, when a sulfuric acid etchant is used, only the InGaAsP second etching stop layer is etched, and the InGaP first etching stop layer is not etched. That is, it is possible to stop the etching accurately on the upper boundary of the first etching stop layer, and thus the index-guided structure and the stripe width can be accurately formed by etching.

(g) When the InGaP cap layer is formed on the $In_{x3}(Al_{z3}Ga_{1-z3})P$ current confinement layer, it is possible to prevent formation of a natural oxidation film on the $In_{x3}(Al_{z3}Ga_{1-z3})_{1-x3}P$ current confinement layer, as well as metamorphic change in the $In_{x3}(Al_{z3}Ga_{1-z3})_{1-x3}P$ current confinement layer, which occurs when a resist layer is formed directly on the $In_{x3}(Al_{z3}Ga_{1-z3})_{1-x3}P$ current confinement layer.

(h) When each of the lower optical waveguide layer and the first and second upper optical waveguide layers is made of $In_{x2}Ga_{1-x2}P$ or $In_{x2}Ga_{1-x2}As_{y2}P_{1-y2}$, the band gap difference between the active layer and the optical waveguide layers can be made greater than the band gap differences in the conventional semiconductor laser devices. Therefore, the leakage current can be prevented, carriers can be efficiently confined, and thus the threshold current can be lowered.

(i) When the tensile strain barrier layers made of InGaP, InGaAsP, or GaAsP are formed above and below the compressive strain quantum well active layer, respectively, various characteristics are improved (e.g., the threshold current is lowered), and reliability is increased.

(j) When each of the lower and upper cladding layers is made of one of AlGaAs, InGaAlP, and InGaAlPAs which lattice-match with the GaAs substrate, carriers and light can be effectively confined within the active layer, and the efficiency can be increased, since the band gaps of the cladding layers made of such materials are greater than the band gaps of the optical waveguide layers, and the refractive indexes of the cladding layers are smaller than the refractive indexes of the optical waveguide layers.

(k) Since the solid-state laser apparatuses according to the ninth and tenth aspects of the present invention use as excitation light sources the reliable, high power semiconductor laser devices according to the fifth and sixth aspects of the present invention, reliable, high power solid-state laser apparatuses are realized.

(1) In particular, when the semiconductor laser devices used in the solid-state laser apparatuses according to the ninth or tenth aspect of the present invention have an oscillation region (i.e., a stripe groove) with a width of 10 μm or broader, reliable, high power laser light can be obtained.

(m) In particular, when the solid-state laser apparatuses according to the ninth or tenth aspect of the present invention comprise a wavelength conversion crystal which converts the solid-state laser light into a second harmonic, reliable, high power second harmonic laser light can be obtained.

DESCRIPTION OF THE DRAWINGS

FIGS. 1A to 2D are cross-sectional views of representative stages in a process for producing a semiconductor laser device as the first embodiment of the present invention.

FIGS. 2A to 2D are cross-sectional views of representative stages in a process for producing a semiconductor laser device as the second embodiment of the present invention.

FIG. 10 is a perspective view of a conventional semiconductor laser device.

DESCRIPTION OF PREFERRED EMBODIMENTS

Embodiments of the present invention are explained in detail below with reference to drawings.

First Embodiment

FIGS. 1A to 1D show cross sections of the representative stages in the process for producing a semiconductor laser device as the first embodiment, where the cross sections are perpendicular to the direction of light emitted from the semiconductor laser device.

Figure 1B:
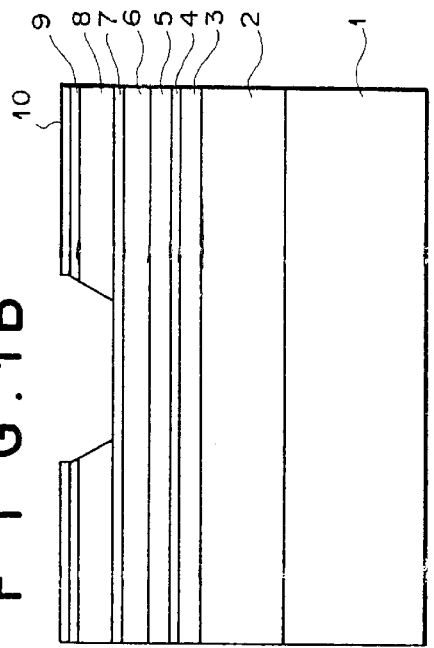
Figure 1D:
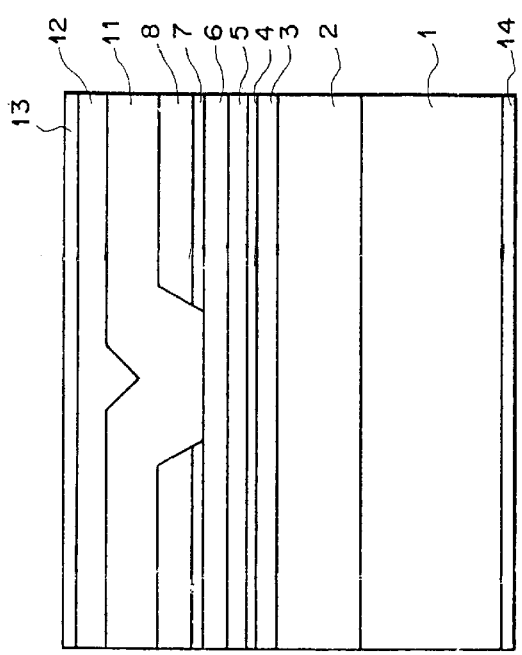
Figure 1A:
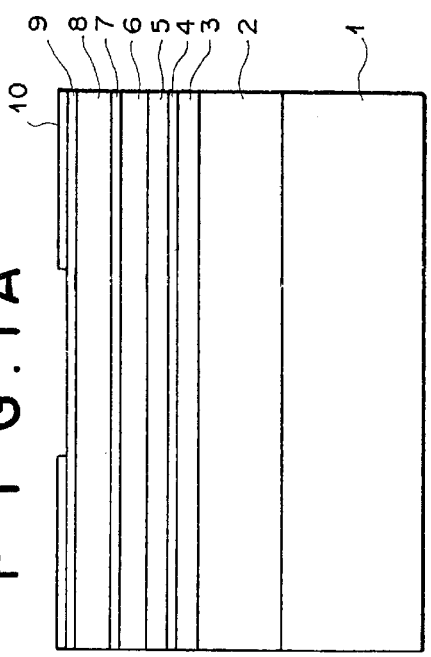

First, as illustrated in FIG. 1A, an n-type $In_{x8}Ga_{1-x8}P$ lower cladding layer 2 ($x8=0.49\pm0.01$), an n-type or i-type (intrinsic) $In_{x2}Ga_{1-x2}As_{1-y2}P_{y2}$ optical waveguide layer 3 ($x2=(0.49\pm0.01)y2$, $023 \ x2 \leq 0.3$), an $In_{x3}Ga_{1-x3}As_{1-y3}P_{y3}$ compressive strain quantum well active layer 4 ($0<x3 \leq 0.4$, $0 \leq y3 \leq 0.1$), a p-type or i-type (intrinsic) $In_{x2}Ga_{1-x2}As_{1-y2}P_{y2}$ optical waveguide layer 5 ($x2=(0.49\pm0.01)y2$, $0 \leq x2 \leq 0.3$), a p-type $In_{x8}Ga_{1-x8}P$ first upper cladding layer 6 ($x8=0.49\pm0.01$), an n-type or p-type $In_{x1}Ga_{1-x1}As_{1-y1}P_{y1}$ etching stop layer 7 ($0 \leq x1 \leq 0.3$, $0 \leq y1 \leq 0.3$) having a thickness of, for example, 20 nm, an n-type $In_{x8}Ga_{1-x8}P$ current confinement layer 8 having a thickness of, for example, 1 μm, and a GaAs cap layer 9 having a thickness of, for example, 10 nm are formed on an n-type GaAs substrate 1 by organometallic vapor phase epitaxy. Then, a $SiO_2$ film 10 is formed over the GaAs cap layer 9, and a stripe area of the $SiO_2$ film 10 having a width of about 3 μm and extending in the <011> direction is removed by conventional lithography so that a stripe area of the GaAs cap layer 9 is exposed.

Next, as illustrated in FIG. 1B, the exposed stripe area of the GaAs cap layer 9 is etched with a sulfuric acid etchant by using the $SiO_2$ film 10 as a mask. Then, a stripe area of the n-type $In_{x8}Ga_{1-x8}P$ current confinement layer 8 is etched with a hydrochloric acid etchant until a stripe area of the n-type or p-type $In_{x1}Ga_{1-x1}As_{1-y1}P_{y1}$ etching stop layer 7 is exposed.

Figure 1C:
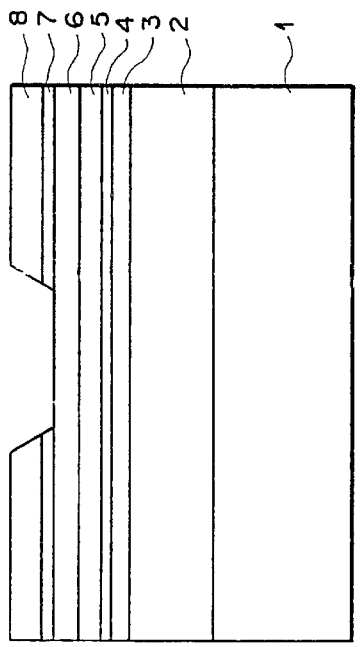

Thereafter, as illustrated in FIG. 1C, the remaining areas of the $SiO_2$ film 10 are removed by etching with a fluoric acid etchant. Then, the remaining areas of the GaAs cap layer 9 and the exposed area of the n-type or p-type $In_{x1}Ga_{1-x1}As_{1-y1}P_{y1}$ etching stop layer 7 are removed by etching with a sulfuric acid etchant.

Finally, as illustrated in FIG. 1D, a p-type $Al_{z4}Ga_{1-z4}As$ second upper cladding layer 11 ($0.2 \leq z4 \leq 0.5$) and a p-type GaAs contact layer 12 are formed over the layered structure of FIG. 1C. Then, a p electrode 13 is formed on the p-type GaAs contact layer 12. In addition, the exposed surface of the substrate 1 is polished, and an n electrode 14 is formed on the polished surface of the substrate 1. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type $In_{x8}Ga_{1-x8}P$ first upper cladding layer 6 has such a thickness that oscillation in a fundamental transverse mode can be maintained even when output power becomes high. In addition, since a current confinement structure and a real refractive index structure are realized by the p-type $Al_{z4}Ga_{1-z4}As$ second upper cladding layer 11 and the n-type $In_{x8}Ga_{1-x8}P$ current confinement layer 8, it is possible to realize a difference of about $1.5 \times 10^{-3}$ to $1 \times 10^{-2}$ in the equivalent refractive index between the portions of the active region under the current confinement layer and the other portion of the active region under the stripe groove. Therefore, oscillation in a fundamental transverse mode can be maintained even when the output power becomes high, and thus a reliable semiconductor laser device can be realized.

The GaAs cap layer may be one of the n type, p type, and the undoped type. In addition, since a GaAs cap layer is formed on the InGaP current confinement layer, it is possible to prevent formation of a natural oxidation film on the InGaP current confinement layer, and metamorphic change in the InGaP current confinement layer, which occurs when a resist layer is formed directly on the InGaP current confinement layer. In addition, since the GaAs cap layer is removed before the second upper cladding layer is formed, it is possible to remove a residue left on the base layer on which the second upper cladding layer is formed, and prevent the occurrence of crystal defects.

Second Embodiment

FIGS. 2A to 2D show cross sections of the representative stages in the process for producing a semiconductor laser device as the second embodiment, where the cross section is perpendicular to the direction of light emitted from the semiconductor laser device.

Figure 2B:
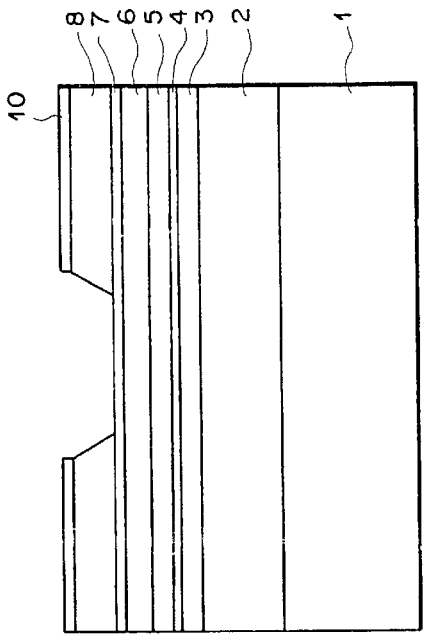
Figure 2D:
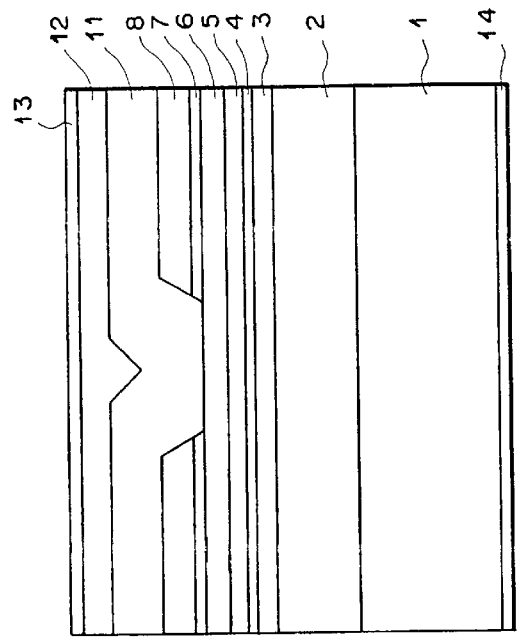
Figure 2A:
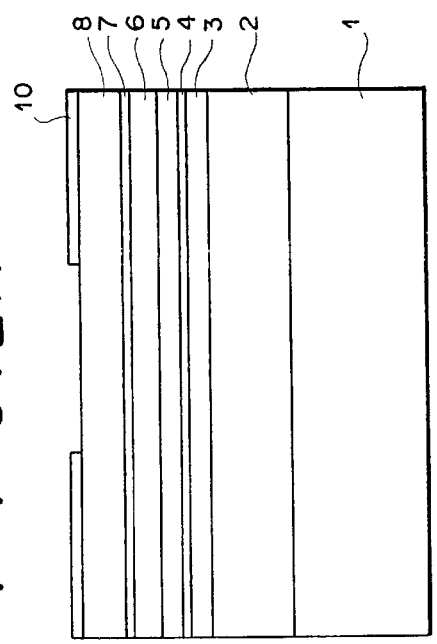
Figure 2C:
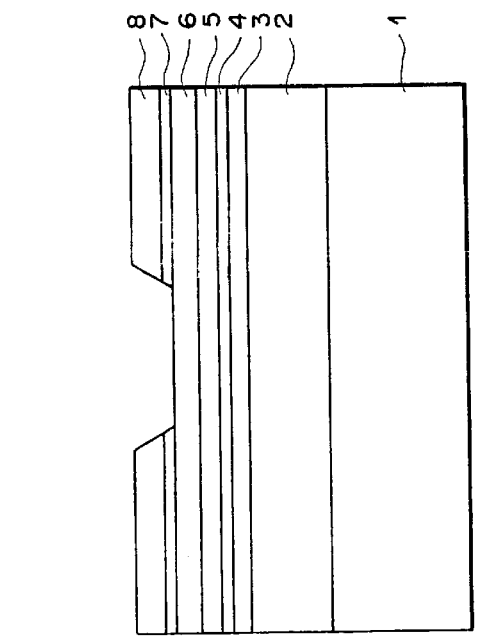

The construction of the semiconductor laser device as the second embodiment is different from the first embodiment in that the GaAs cap layer 9 in the first embodiment is not formed. That is, a $SiO_2$ film 10 is formed directly on the InGaP current confinement layer 8, as illustrated in FIG. 2A. Then, as illustrated in FIG. 2B, a stripe area of the $In_{x8}Ga_{1-x8}P$ current confinement layer 8 is etched with a hydrochloric acid etchant by using the $SiO_2$ film 10 as a mask until the $In_{x1}Ga_{1-x1}As_{1-y1}P_{y1}$ etching stop layer 7 is exposed. Next, as illustrated in FIG. 2C, the remaining areas of the $SiO_2$ film 10 are removed by etching with a fluoric acid etchant. Then, the exposed area of the $In_{x1}Ga_{1-x1}As_{1-y1}P_{y1}$ etching stop layer 7 is removed by etching with a sulfuric acid etchant. Thereafter, through the same process as the first embodiment, the semiconductor laser device as the second embodiment is formed as illustrated in FIG. 2D.

Third Embodiment

Figure 3:
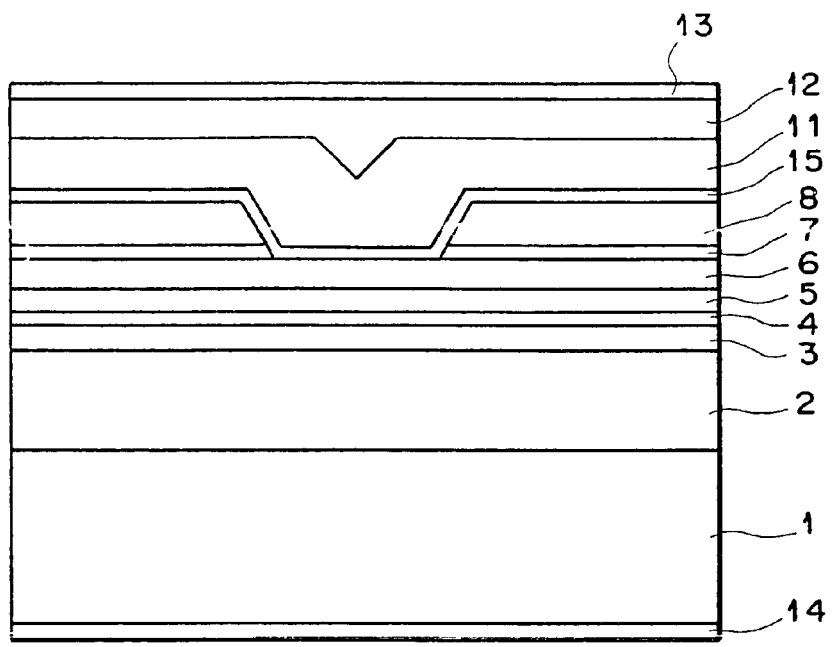
FIG. 3 is a cross-sectional view of a semiconductor laser device as the third embodiment of the present invention.

FIG. 3 shows a cross section of a semiconductor laser device as the third embodiment, where the cross section is perpendicular to the direction of light emitted from the semiconductor laser device. The construction of the semiconductor laser device as the third embodiment is different from the first embodiment in that an InGaP layer is formed before the second upper cladding layer is formed.

That is, after the $SiO_2$ film 10 is removed by etching with a fluoric acid etchant, and a stripe area of the GaAs cap layer 9 and the exposed stripe area of the $In_{x1}Ga_{1-x1}As_{1-y1}P_{y1}$ etching stop layer 7 are removed by etching with a sulfuric acid etchant in the same manner as the first embodiment, a p-type $In_{x8}Ga_{1-x8}P$ layer 15 ($x8=0.49\pm0.01$) having a thickness of, for example, about 50 nm is formed as illustrated in FIG. 3. Then, the p-type $Al_{z4}Ga_{1-z4}As$ second upper cladding layer 11 ($0.20 \leq z4 \leq 0.50$) and the p-type GaAs contact layer 12 are formed on the p-type $In_{x8}Ga_{1-x8}P$ layer 15. Thereafter, through the same process as the first embodiment, the semiconductor laser device as the third embodiment is formed into a chip.

Due to the provision of the p-type $In_{x8}Ga_{1-x8}P$ layer 15, the control range of the Al composition in the $Al_{z4}Ga_{1-z4}As$ second upper cladding layer can be increased. When the thickness of the cladding layer is about 100 nm, it is preferable that the thickness of the $In_{x8}Ga_{1-x8}P$ layer 15 is 10 to 400 nm. In particular, the optimum thickness of the $In_{x8}Ga_{1-x8}P$ layer is 250 to 300 nm.

Fourth Embodiment

Figure 4:
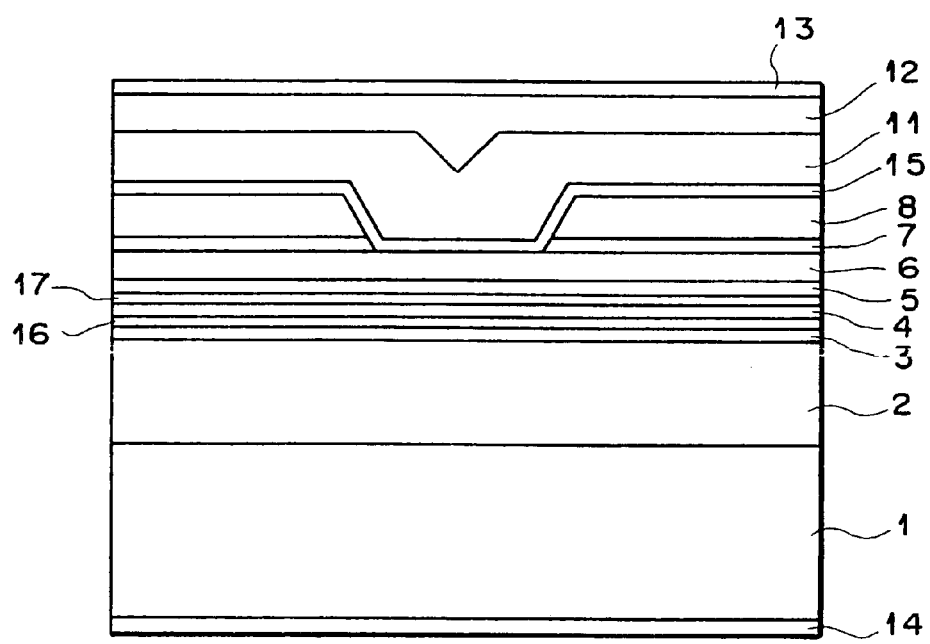
FIG. 4 is a cross-sectional view of a semiconductor laser device as the fourth embodiment of the present invention.

FIG. 4 shows a cross section of a semiconductor laser device as the fourth embodiment, where the cross section is perpendicular to the direction of light emitted from the semiconductor laser device. The construction of the semiconductor laser device as the fourth embodiment is different from the first embodiment in that an $In_{x5}Ga_{1-x5}As_{1-y5}P_{y5}$ tensile strain barrier layer 16 ($0 \leq x5 \leq 0.3$, $0<y5 \leq 0.6$) and an $In_{x5}Ga_{1-x5}As_{1-y5}P_{y5}$ tensile strain barrier layer 17 are formed below and above the $In_{x3}Ga_{1-x3}As_{1-y3}P_{y3}$ compressive strain quantum well active layer 4 ($0<x3 \leq 0.4$, $0 \leq y3 \leq 0.1$), respectively. Due to the provision of the $In_{x5}Ga_{1-x5}As_{1-y5}P_{y5}$ tensile strain barrier layer 16 ($0 \leq x5 \leq 0.3$, $0<y5 \leq 0.6$) and the $In_{x5}Ga_{1-x5}As_{1-y5}P_{y5}$ tensile strain barrier layer 17, various characteristics are improved (e.g., the threshold current is lowered), and reliability is increased.

Fifth Embodiment

FIGS. 5A to 5D show cross sections of the representative stages in the process for producing a semiconductor laser device as the fifth embodiment, where the cross sections are perpendicular to the direction of light emitted from the semiconductor laser device.

Figure 5A:
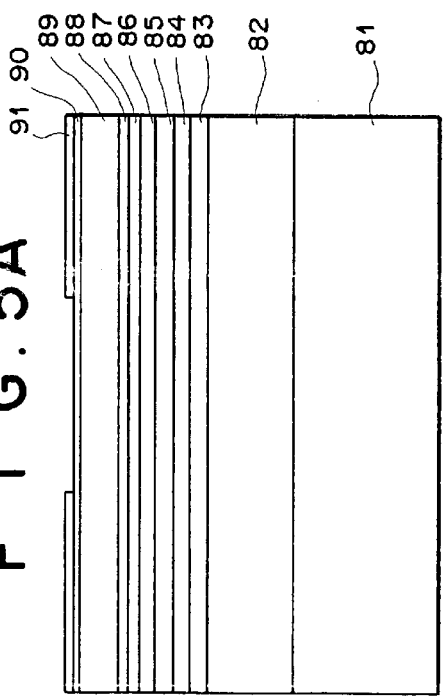
FIGS. 5A to 5D are cross-sectional views of representative stages in a process for producing a semiconductor laser device as the fifth embodiment of the present invention.

First, as illustrated in FIG. 5A, an n-type $In_{x6}Ga_{1-x6}As_{1-y6}P_{y6}$ lower cladding layer 82 ($x6=(0.49\pm0.01)y6$, $0.2<y6<1$), an n-type or i-type $In_{x2}Ga_{1-x2}As_{1-y2}P_{y2}$ optical waveguide layer 83 ($x2=(0.49\pm0.01)y2$, $0 \leq x2<x6$), an $In_{x3}Ga_{1-x3}As_{1-y3}P_{y3}$ compressive strain quantum well active layer 84 ($0<x3 \leq 0.4$, $0 \leq y3 \leq 0.1$), a p-type or i-type $In_{x2}Ga_{1-x2}As_{1-y2}P_{y2}$ optical waveguide layer 85, a p-type $In_{x6}Ga_{1-x6}As_{1-y6}P_{y6}$ first upper cladding layer 86, a p-type $In_{x7}Ga_{1-x7}P$ first etching stop layer 87 ($0 \leq x7 \leq 1$), a p-type $In_{x1}Ga_{1-x1}As_{1-y1}P_{y1}$ second etching stop layer 88 ($0 \leq x1 \leq 0.3$, $0 \leq y1 \leq 0.3$) having a thickness of, for example, 20 nm, an n-type $In_{x8}Ga_{1-x8}P$ current confinement layer 89

(x8=0.49±0.01) having a thickness of, for example, 1 μm, and a GaAs cap layer 90 having a thickness of, for example, 10 nm are formed on an n-type GaAs substrate 81 by organometallic vapor phase epitaxy. Then, a $SiO_2$ film 91 is formed over the n-type GaAs cap layer 90, and a stripe area of the $SiO_2$ film 91 having a width of about 3 μm and extending in the <011> direction is removed by conventional lithography.

Figure 5B:
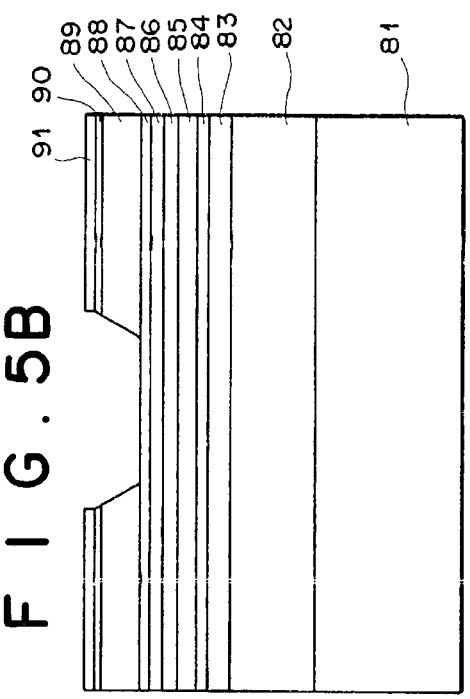

Next, as illustrated in FIG. 5B, a stripe area of the n-type GaAs cap layer 90 is etched with a sulfuric acid etchant by using the $SiO_2$ film 91 as a mask. Then, a stripe area of the n-type $In_{x8}Ga_{1-x8}P$ current confinement layer 89 is etched with a hydrochloric acid etchant until a stripe area of the p-type $In_{x1}Ga_{1-x1}As_{1-y1}P_{y1}$ second etching stop layer 88 is exposed.

Figure 5C:
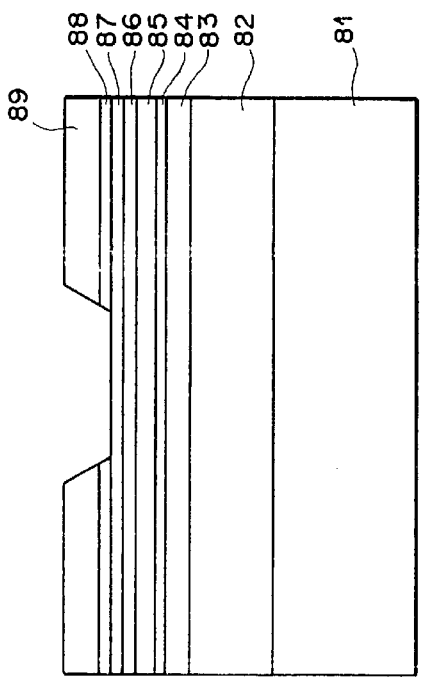

Thereafter, as illustrated in FIG. 5C, the remaining areas of the $SiO_2$ film 91 are removed by etching with a fluoric acid etchant and the remaining areas of the n-type GaAs cap layer 90 and a stripe area of the p-type $In_{x1}Ga_{1-x1}As_{1-y1}P_{y1}$ second etching stop layer 88 are them removed by etching with a sulfuric acid etchant so that a stripe area of the p-type $In_{x7}Ga_{1-x7}P$ first etching stop layer 87 is exposed.

Figure 5D:
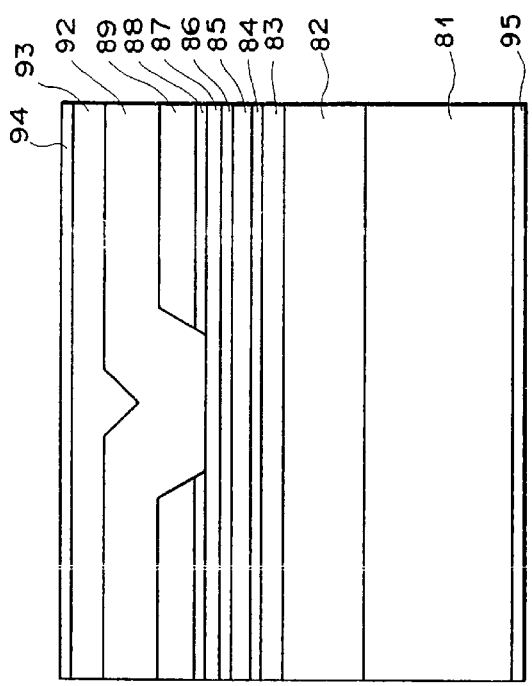
Figure 6B:
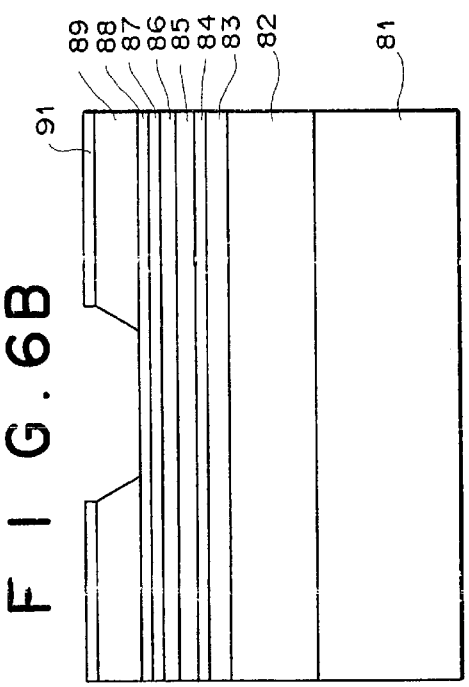
FIGS. 6A to 6D are cross-sectional views of representative stages in a process for producing a semiconductor laser device as the sixth embodiment of the present invention.
Figure 6D:
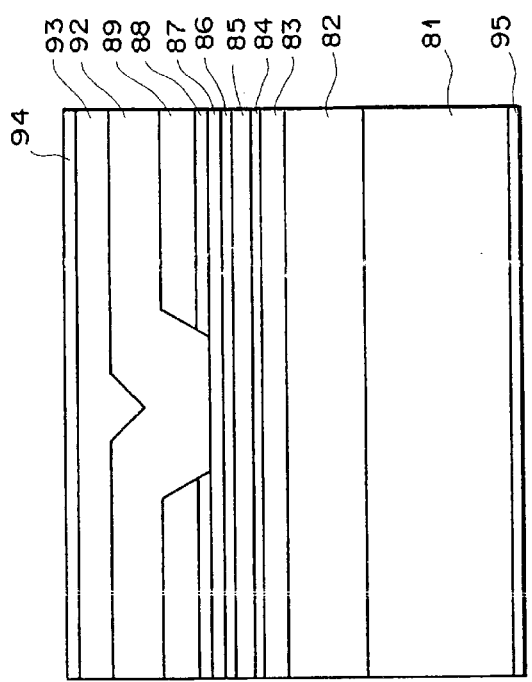
Figure 6A:
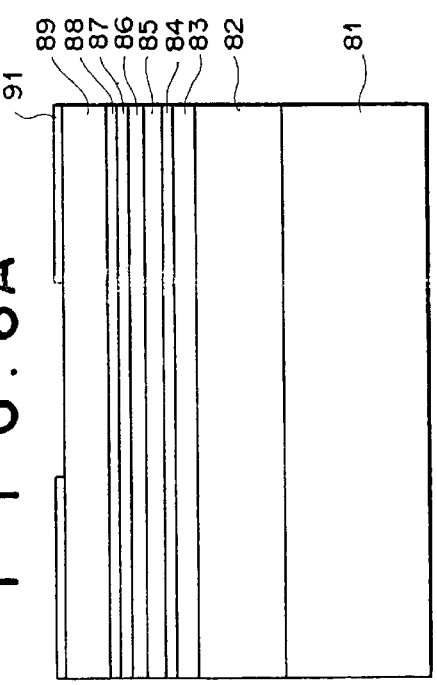
Figure 6C:
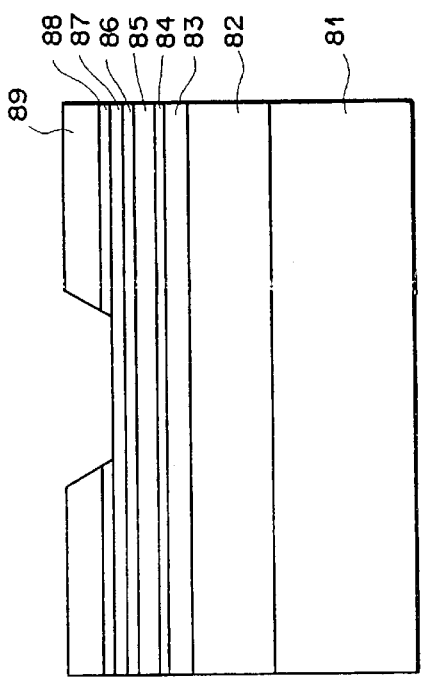

Finally, as illustrated in FIG. 5D, a p-type $Al_{z4}Ga_{1-z4}As$ second upper cladding layer 92 ($0.20 \leq z4 \leq 0.50$) and a p-type GaAs contact layer 93 are formed over the layered structure of FIG. 6C. Then, a p electrode 94 is formed on the p-type GaAs contact layer 93. In addition, the exposed surface of the substrate 81 is polished, and an n electrode 95 is formed on the polished surface of the substrate 81. Next, both end surfaces of the layered construction are cleaved, and a high reflectance coating and a low reflectance coating are provided on the respective end surfaces so as to form a resonator. Then, the above construction is formed into a chip of a semiconductor laser device.

In the construction of the fifth embodiment, the GaAs cap layer is the n type, p type, or undoped type.

Sixth Embodiment

In the construction of the fifth embodiment, the n-type GaAs cap layer may be dispensed with. FIGS. 6A to 6D show cross sections of the representative stages in the process for producing a semiconductor laser device as the sixth embodiment, where the cross sections are perpendicular to the direction of light emitted from the semiconductor laser device.

The construction of the semiconductor laser device as the sixth embodiment is different from the fifth embodiment in that the GaAs cap layer 90 in the fifth embodiment is not formed. That is, the $SiO_2$ film 91 is formed directly on the InGaP current confinement layer 89, as illustrated in FIG. 6A. Then, as illustrated in FIG. 6B, a stripe area of the $In_{x8}Ga_{1-x8}P$ current confinement layer 89 is etched with a hydrochloric acid etchant by using the $SiO_2$ film 91 as a mask until a stripe area of the $In_{x1}Ga_{1-x1}As_{1-y1}P_{y1}$ second etching stop layer 88 is exposed. Next, as illustrated in FIG. 6C, the remaining areas of the $SiO_2$ film 91 are removed by etching with a fluoric acid etchant. Then, the exposed stripe area of the $In_{x1}Ga_{1-x1}As_{1-y1}P_{y1}$ second etching stop layer 88 is removed by etching with a sulfuric acid etchant. Thereafter, through the same process as the fifth embodiment, the semiconductor laser device as the sixth embodiment is formed as illustrated in FIG. 6D.

Seventh Embodiment

Figure 7:
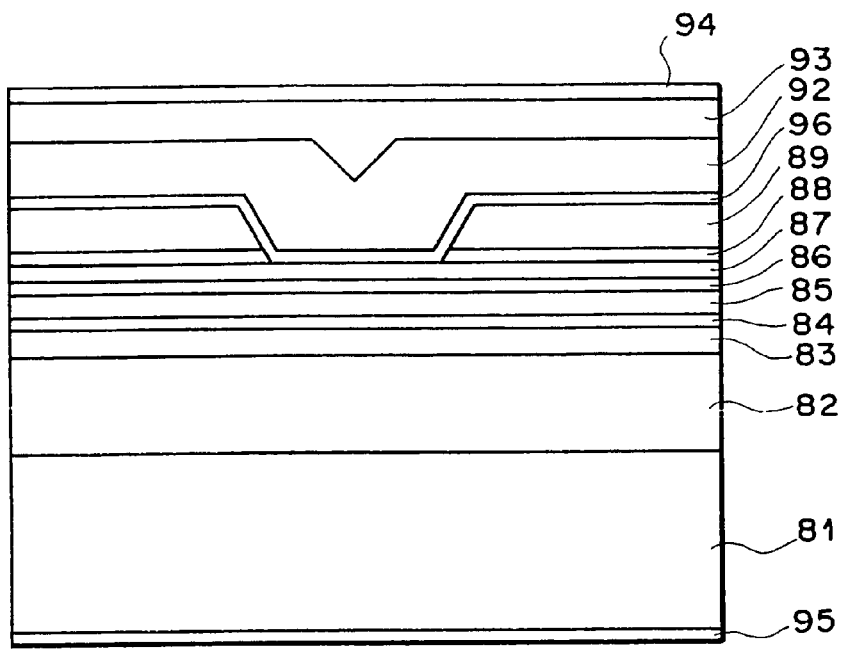
FIG. 7 is a cross-sectional view of a semiconductor laser device as the seventh embodiment of the present invention.

FIG. 7 shows a cross section of a semiconductor laser device as the seventh embodiment, where the cross section is perpendicular to the direction of light emitted from the semiconductor laser device. The construction of the semiconductor laser device as the seventh embodiment is different from the fifth embodiment in that an InGaP layer is formed before the second upper cladding layer is formed.

That is, after the $SiO_2$ film 91 is removed by etching with a fluoric acid etchant, and the GaAs cap layer 90 and the stripe area of the p-type $In_{x1}Ga_{1-x1}As_{1-y1}P_{y1}$ second etching stop layer 88 are removed by etching with a sulfuric acid etchant in the same manner as the fifth embodiment, a p-type $In_{x8}Ga_{1-x8}P$ layer 96 (x8=0.49±0.01) having a thickness of, for example, about 50 nm is formed as illustrated in FIG. 7. Then, the p-type $Al_{z4}Ga_{1-z4}As$ second upper cladding layer 92 ($0.20 \leq z4 \leq 0.50$) and the p-type GaAs contact layer 93 are formed on the p-type $In_{x8}Ga_{1-x8}P$ layer 96. Thereafter, through the same process as the fifth embodiment, the semiconductor laser device as the seventh embodiment is formed into a chip.

Similar to the third embodiment, when the thickness of the cladding layer is about 100 nm, it is preferable that the thickness of the $In_{x8}Ga_{1-x8}P$ layer 96 is 10 to 400 nm. In particular, the optimum thickness of the $In_{x8}Ga_{1-x8}P$ layer is 250 to 300 nm.

Eighth Embodiment

Figure 8:
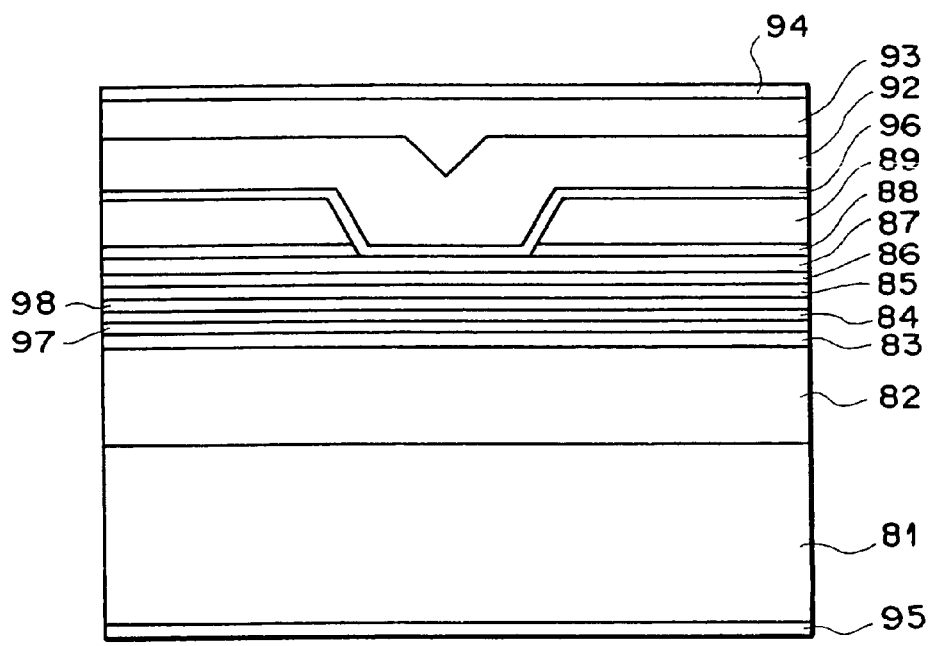
FIG. 8 is a cross-sectional view of a semiconductor laser device as the eighth embodiment of the present invention.

FIG. 8 shows a cross section of a semiconductor laser device as the eighth embodiment, where the cross section is perpendicular to the direction of light emitted from the semiconductor laser device. The construction of the semiconductor laser device as the eighth embodiment is different from the fifth embodiment in that an $In_{x5}Ga_{1-x5}As_{1-y5}P_{y5}$ tensile strain barrier layer 97 ($0 \leq x5 \leq 0.3, 0 < y5 \leq 0.6$) and an $In_{x5}Ga_{1-x5}As_{1-y5}P_{y5}$ tensile strain barrier layer 98 are formed below and above the $In_{x3}Ga_{1-x3}As_{1-y3}P_{y3}$ compressive strain quantum well active layer 84 ($0 < x3 \leq 0.4, 0 \leq y3 \leq 0.1$), respectively. Due to the provision of the $In_{x5}Ga_{1-x5}As_{1-y5}P_{y5}$ tensile strain barrier layer 97 ($0 \leq x5 \leq 0.3, 0 < y5 \leq 0.6$) and the $In_{x5}Ga_{1-x5}As_{1-y5}P_{y5}$ tensile strain barrier layer 98, various characteristics are improved (e.g., the threshold current is lowered), and reliability is increased.

Additional Matters to First to Eighth Embodiments (i) In the semiconductor laser devices as the first to fourth embodiments, the lower cladding layer may be made of $Al_{z5}Ga_{1-z5}As$, where $0.25 \leq z5 \leq 0.7$, and the optical waveguide layers may be made of $Al_{z2}Ga_{1-z2}As$, where $0 \leq z2 \leq 0.2$.

(ii) In the semiconductor laser devices as the fifth to eighth embodiments, the lower cladding layer and the first upper cladding layer may be made of $Al_{z5}Ga_{1-z5}As$, where $0.25 \leq z5 \leq 0.7$.

(iii) Due to the $In_{x3}Ga_{1-x3}As_{1-y3}P_{y3}$ compressive strain quantum well active layers ($0 < x3 \leq 0.4, 0 \leq y3 \leq 0.1$), the oscillation wavelengths of the semiconductor laser devices as the first to eighth embodiments can be controlled in the range of 900 to 1,200 nm.

(iv) The constructions of the first to eighth embodiments can be used not only in an index-guided structure semiconductor laser devices, but also in other semiconductor laser devices having a diffraction lattice, as well as in optical integrated circuits.

(v) Although n-type GaAs substrates are used in the constructions of the first to eighth embodiments, instead, p-type GaAs substrates may be used. When the GaAs substrate is a p-type, the conductivity types of all of the other layers in the constructions of the first to eighth embodiments should be inverted.

(vi) The constructions of the first to eighth embodiments can be used not only in semiconductor laser devices which oscillate in a fundamental transverse mode, but also in index-guided broad-stripe semiconductor laser devices which are designed for realizing high output power, have a stripe width of 3 μm or greater, and oscillate in multiple modes.

(vii) Although the constructions of the first to eighth embodiments have a so-called single-quantum-well separate-confinement heterostructure (SQW–SCH) which includes a single quantum well and an optical waveguide made of a material having a fixed composition, instead, a multiple quantum well structure made of a plurality of quantum wells may be used.

(viii) Each layer in the constructions of the first to eighth embodiments may be formed by molecular beam epitaxy using solid or gas raw material.

(ix) In addition, all of the contents of the Japanese Patent Application, No. 2000-031733 are incorporated into this specification by reference.

Ninth Embodiment

FIGS. 9A to 9D show cross sections of the representative stages in the process for producing a semiconductor laser device as the ninth embodiment, where the cross sections are perpendicular to the direction of light emitted from the semiconductor laser device.

Figure 9B:
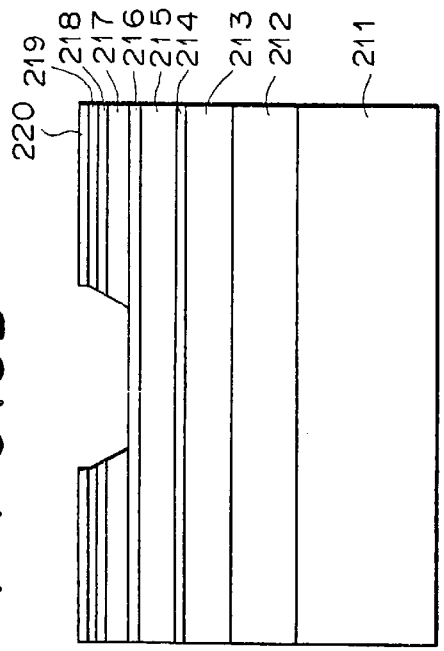
FIGS. 9A to 9D are cross-sectional views of representative stages in a process for producing a semiconductor laser device as the ninth embodiment of the present invention.
Figure 9D:
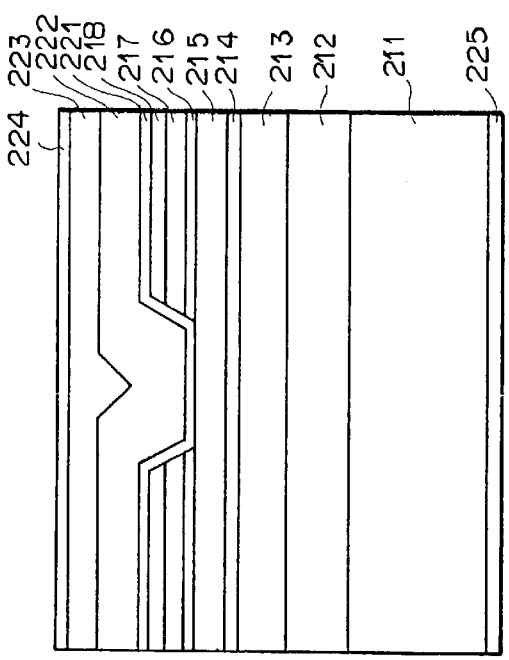
Figure 9A:
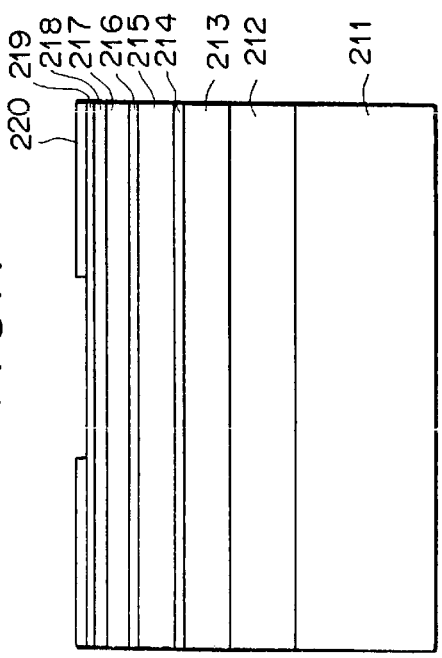

First, as illustrated in FIG. 9A, an n-type $Ga_{0.37}Al_{0.63}As$ lower cladding layer 212, an n-type or i-type (intrinsic) $In_{0.49}Ga_{0.51}P$ lower optical waveguide layer 213 having a thickness of, for example, 400 nm, an $In_{0.12}Ga_{0.88}As_{0.75}P_{0.25}$ quantum well active layer 214 having a thickness of, for example, 8 nm, a p-type or i-type (intrinsic) $In_{0.49}Ga_{0.51}P$ first upper optical waveguide layer 215 having a thickness of, for example, 200 nm, a p-type $In_{x1}Ga_{1-x1}As_{1-y1}P_{y1}$ etching stop layer 216 ($0 \leq x1 \leq 0.5$, $0 \leq y1 \leq 0.8$) having a thickness of, for example, 20 nm, an n-type $In_{0.49}(Al_{0.1}Ga_{0.9})_{0.5}P$ current confinement layer 217, an n-type $In_{0.49}Ga_{0.51}P$ cap layer 218 having a thickness of, for example, 20 nm, and an n-type GaAs cap layer 219 having a thickness of, for example, 10 nm are formed on an n-type GaAs substrate 211 by organometallic vapor phase epitaxy. Then, a $SiO_2$ film 220 is formed over the $In_{0.49}Ga_{0.51}P$ cap layer 219, and a stripe area having a width of about 50 μm of the $SiO_2$ film 220 is removed by conventional lithography so that a stripe area of the n-type GaAs cap layer 219 is exposed.

Next, as illustrated in FIG. 9B, the exposed stripe area of the n-type GaAs cap layer 219 is etched with a sulfuric acid etchant by using the $SiO_2$ film 220 as a mask. Then, an exposed stripe area of the n-type $In_{0.49}Ga_{0.51}P$ cap layer 218 and a corresponding stripe area of the n-type $In_{0.49}(Al_{0.1}Ga0.9)_{0.51}P$ current confinement layer 217 are etched with a hydrochloric acid etchant until a stripe area of the p-type $In_{x1}Ga_{1-x1}As_{1-y1}P_{y1}$ etching stop layer 216 is exposed.

Figure 9C:
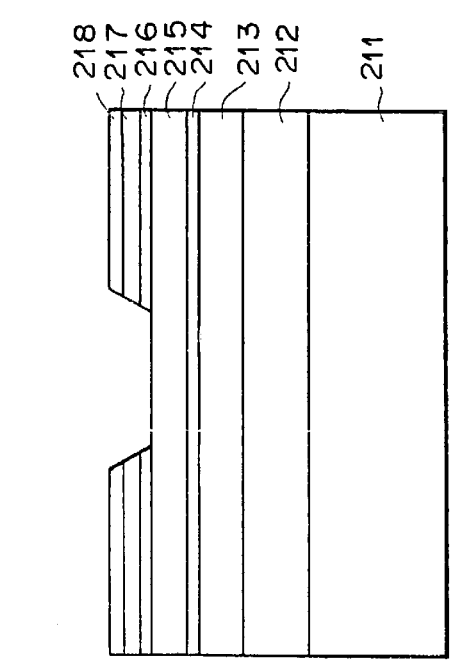

Thereafter, as illustrated in FIG. 9C, the remaining areas of the $SiO_2$ film 220 are removed by etching with a fluoric acid etchant. Then, the remaining areas of the n-type GaAs cap layer 219 and the exposed stripe area of the p-type $In_{x1}Ga_{1-x1}As_{1-y1}P_{y1}$ etching stop layer 216 are removed by etching with a sulfuric acid etchant.

Finally, as illustrated in FIG. 9D, a p-type $In_{0.49}Ga_{0.51}P$ second upper optical waveguide layer 221 having a thickness of, for example, 200 nm, a p-type $Ga_{0.37}Al_{0.63}As$ upper cladding layer 222 having a thickness of, for example, 1 μm, and a p-type GaAs contact layer 223 having a thickness of, for example, 3 μm are formed over the layered structure of FIG. 9C. Then, a p electrode 224 is formed on the p-type GaAs contact layer 223. In addition, the exposed surface of the substrate 211 is polished, and an n electrode 225 is formed on the polished surface of the substrate 211. Next, both end surfaces of the layered construction are cleaved, and a high reflectance coating 226 and a low reflectance coating 227 are provided on the respective end surfaces so as to form a resonator. Then, the above construction is formed into a chip of a semiconductor laser device.

Finally, the p electrode side of the laser chip is bonded to a heat sink or the like with conductive indium solder. Then, the semiconductor laser device is bonded to a heat sink or the like at a surface of the semiconductor laser device with conductive indium solder, where the surface is located nearer to the active layer than the opposite surface of the semiconductor laser device. That is, the semiconductor laser device is bonded to the heat sink or the like so as to form the so-called junction-down configuration.

Comparison with Conventional Device with Respect to Noise

Noise generated in the semiconductor laser device as the ninth embodiment of the present invention is compared with noise generated in a conventional semiconductor laser device.

FIG. 10 is a perspective view of a conventional semiconductor laser device. The semiconductor laser device of FIG. 10 is formed as follows.

First, an n-type $Ga_{0.37}Al_{0.63}As$ lower cladding layer 232, an n-type $In_{0.49}Ga_{0.51}P$ lower optical waveguide layer 233 having a thickness of, for example, 400 nm, an $In_{0.12}Ga_{0.88}As_{0.75}P_{0.25}$ quantum well active layer 234 having a thickness of, for example, 8 nm, a p-type or i-type (intrinsic) $In_{0.49}Ga_{0.51}P$ upper optical waveguide layer 235 having a thickness of, for example, 400 nm, a p-type $Ga_{0.37}Al_{0.63}As$ cladding layer 236, and a p-type GaAs contact layer 237 are formed on an n-type GaAs substrate 231 by organometallic vapor phase epitaxy. Then, a first insulation film (not shown) is formed on p-type GaAs contact layer 237, and parallel stripe areas of the first insulation film, each having a width of about 50 μm, are removed by conventional lithography. Next, the parallel stripe areas of the above layered structure are etched to the depth of the upper surface of the p-type or i-type $In_{0.49}Ga_{0.51}P$ upper optical waveguide layer 235 by wet etching using the remaining areas of the first insulation film as a mask so as to form a ridge stripe structure. When a solution of sulfuric acid and hydrogen peroxide is used as an etchant, the etching automatically stops at the upper boundary of the p-type or i-type $In_{0.49}Ga_{0.51}P$ upper optical waveguide layer 235. Thereafter, the remaining areas of the first insulation film are removed, and then a second insulation film 239 is formed over the ridge stripe structure. Next, a stripe portion of the second insulation film 239 on the top of the ridge stripe is removed by etching by conventional lithography. Then, a p electrode 240 is formed over the above structure. In addition, the exposed surface of the substrate 231 is polished, and an n electrode 241 is formed on the polished surface of the substrate 231. Next, both end surfaces of the layered construction are cleaved, and a high reflectance coating 243 and a low reflectance coating 244 are provided on the respective end surfaces so as to form a resonator. Then, the above construction is formed into a chip of a semiconductor laser device. Finally, the above semiconductor laser device is bonded to a heat sink or the like at a surface of the semiconductor laser device with indium solder, where the surface is located nearer to the active layer than the opposite surface of the semiconductor laser device. That is, the semiconductor laser device is bonded to the heat sink or the like so as to form the so-called junction-down configuration.

Figure 11:
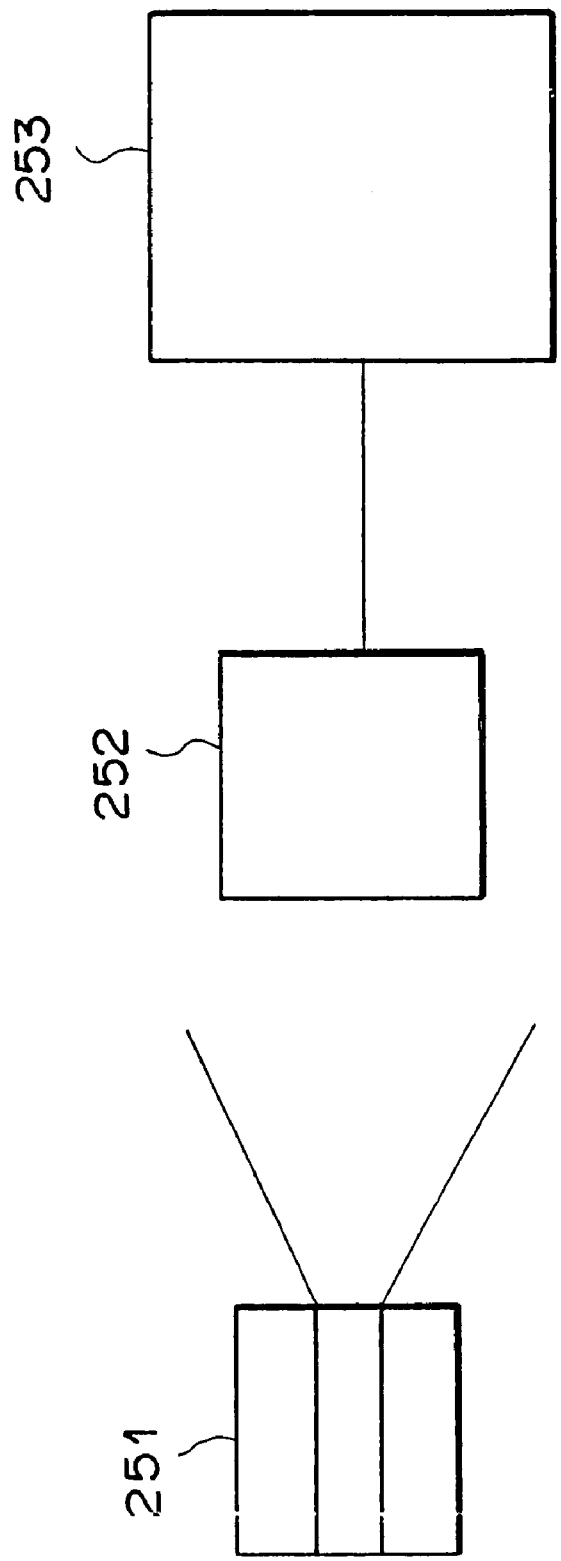
FIG. 11 is a diagram schematically illustrating a configuration of a system for measuring noise.

FIG. 11 is a diagram schematically illustrating a configuration of a system for measuring noise. In the system of FIG. 11, a portion of laser light emitted from a semiconductor laser device 251, which is under temperature control, is received by a light receiving element 252, and noise (stability) of the laser light is measured by a noise measurement device 253. In the measurement, the composition of the etching stop layer in the semiconductor laser devices as the ninth embodiment of the present invention is adjusted as x1=0.34 and y1=0.7, and the resonator lengths of the conventional semiconductor laser devices and the semiconductor laser devices as the ninth embodiment are 0.9 mm. The measurement is made in the optical output range of 100 to 500 mW.

Figure 12:
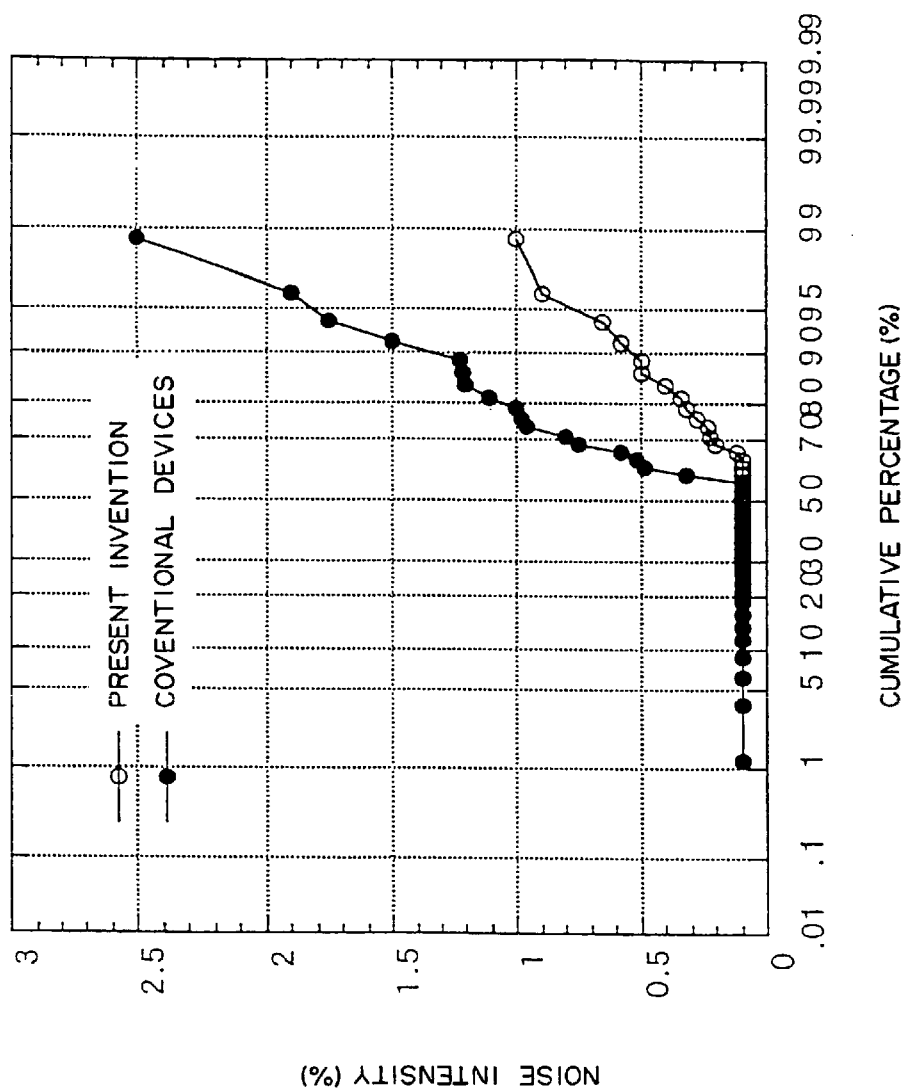
FIG. 12 is a graph indicating results of the noise measurement in the conventional semiconductor laser device and a semiconductor laser device according to the present invention.

The result of the noise measurement is indicated as cumulative distributions in FIG. 12. As illustrated in FIG. 12, when the noise intensity of 1% or less is required, the yield rate of the conventional semiconductor laser devices is 75%, and the yield rate of the semiconductor laser devices as the ninth embodiment of the present invention is 95%. This result indicates that noise reduction in the semiconductor laser device according to the original image is achieved by the junction-down mounting.

Tenth Embodiment

FIGS. 13A to 13D show cross sections of the representative stages in the process for producing a semiconductor laser device as the tenth embodiment, where the cross sections are perpendicular to the direction of light emitted from the semiconductor laser device.

Figure 13B:
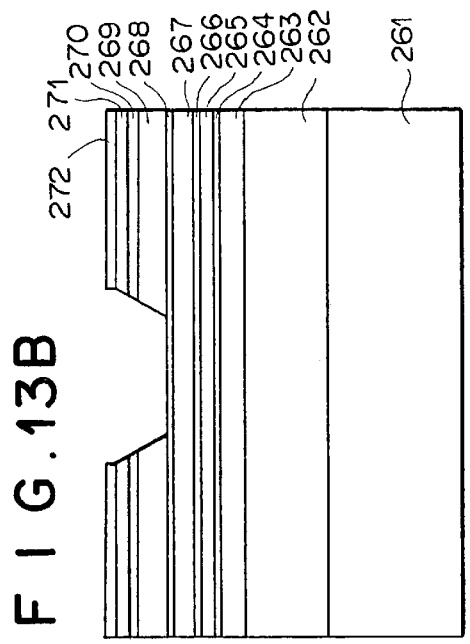
FIGS. 13A to 13D are cross-sectional views of representative stages in a process for producing a semiconductor laser device as the tenth embodiment of the present invention.
Figure 13D:
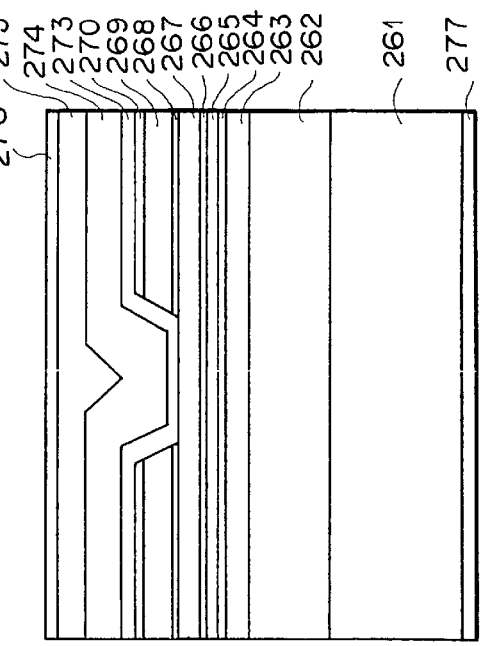
Figure 13A:
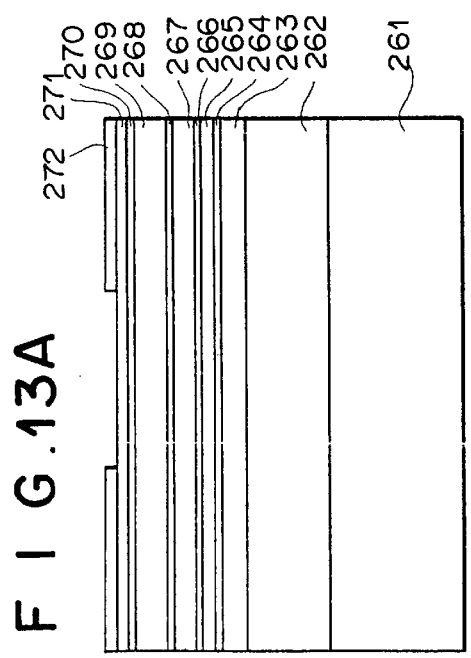

First, as illustrated in FIG. 13A, an n-type $In_{0.49}(Al_{z1}Ga_{1-z1})_{0.51}P$ lower cladding layer 262, an n-type $In_{0.49}Ga_{0.51}P$ lower optical waveguide layer 263, an $In_{x5}Ga_{1-x5}As_{1-y5}P_{y5}$ tensile strain barrier layer 264 ($0 \leq x5 \leq 0.3$, $x5 < 0.49y5$), an $In_{x3}Ga_{1-x3}As_{1-y3}P_{y3}$ compressive strain quantum well active layer 265 ($0 < x3 \leq 0.4$, $x3 > 0.49y3$), an $In_{x5}Ga_{1-x5}As_{1-y5}P_{y5}$ tensile strain barrier layer 266 ($0 \leq x5 \leq 0.3$, $x5 < 0.49y5$), a p-type $In_{0.49}Ga_{0.51}P$ first upper optical waveguide layer 267, a p-type $In_{x1}Ga_{1-x1}As_{1-y1}P_{y1}$ etching stop layer 268 ($0 \leq x1 \leq 0.5$, $0 \leq y1 \leq 0.8$) having a thickness of, for example, 20 nm, an n-type $In_{0.49}(Al_{z3}Ga_{1-z3}Ga_{1-z3})_{0.51}P$ current confinement layer 269 ($0 < z1 \leq z3 \leq 1$) having a thickness of, for example, 1 μm, an n-type $In_{0.49}Ga_{0.51}P$ cap layer 270 having a thickness of, for example, 10 nm, and an n-type GaAs cap layer 271 having a thickness of, for example, 10 nm are formed on an n-type GaAs substrate 261 by organometallic vapor phase epitaxy. Then, a $SiO_2$ film 272 is formed over the n-type GaAs cap layer 271, and a stripe area of the $SiO_2$ film 271 having a width of about 50 μm and extending in the <011> direction is removed by conventional lithography so that a stripe area of the n-type GaAs cap layer 271 is exposed.

As described before, the strain Δa of the active layer is expressed as Δa=(ca−cs)/cs, where cs and ca are the lattice constants of the GaAs substrate and the active layer, respectively, and the strain Δb of the tensile strain barrier layers is expressed as Δb=(cb−cs)/cs, where cb is the lattice constant of the tensile strain barrier layers. That is, the aforementioned sum of the first product and the third product is expressed as Δa·da+Δb·db, where da is the thickness of the active layer, db is the total thickness of the first and second tensile strain barrier layers, the first product is the product of the strain and the thickness of the active layer, and the third product is the product of the strain of the first and second tensile strain barrier layers and the total thickness of the first and second tensile strain barrier layers. Thus, the semiconductor laser device of the tenth embodiment satisfies the requirement, −0.25 nm≦Δa·da+Δb·db≦0.25 nm.

Next, as illustrated in FIG. 13B, the exposed stripe area of the n-type GaAs cap layer 271 is etched with a sulfuric acid etchant by using the $SiO_2$ film 272 as a mask. Then, an exposed stripe area of the n-type $In_{0.49}Ga_{0.51}P$ cap layer 270 and a corresponding stripe area of the n-type $In_{0.49}(Al_{z3}Ga_{1-z3})_{0.51}P$ current confinement layer 269 are etched with a hydrochloric acid etchant until a stripe area of the p-type $In_{x1}Ga_{1-x1}As_{1-y1}P_{y1}$ etching stop layer 268 is exposed.

Figure 13C:
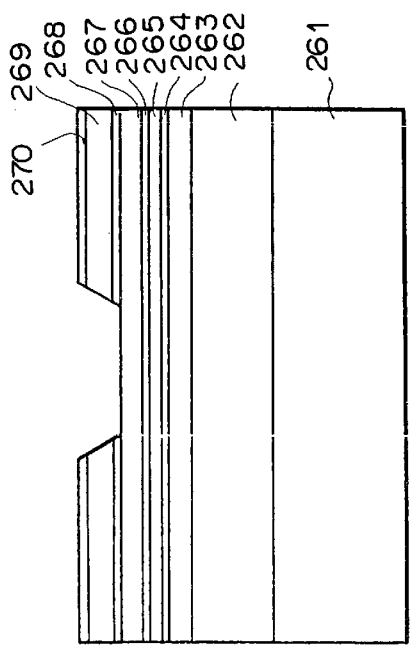

Thereafter, as illustrated in FIG. 13C, the remaining areas of the $SiO_2$ film 272 are removed by etching with a fluoric acid etchant. Then, the remaining areas of the n-type GaAs cap layer 271 and the exposed area of the p-type $In_{x1}Ga_{1-x1}As_{1-y1}P_{y1}$ etching stop layer 268 are removed by etching with a sulfuric acid etchant so that a stripe area of the p-type $In_{0.49}Ga_{0.51}P$ first upper optical waveguide layer 267 is exposed.

Finally, as illustrated in FIG. 13D, a p-type $In_{0.49}Ga_{0.51}P$ second upper optical waveguide layer 273, a p-type $In_{0.49}(Al_{z1}Ga_{1-z1})_{0.51}P$ upper cladding layer 274, and a p-type GaAs contact layer 275 are formed over the layered structure of FIG. 13C. Then, a p electrode 276 is formed on the p-type GaAs contact layer 275. In addition, the exposed surface of the substrate 261 is polished, and an n electrode 277 is formed on the polished surface of the substrate 261. Next, both end surfaces of the layered construction are cleaved, and a high reflectance coating and a low reflectance coating are provided on the respective end surfaces so as to form a resonator. Then, the above construction is formed into a chip of a semiconductor laser device.

In the tenth embodiment, the lower cladding layer and the first upper cladding layer may be made of $Al_{z2}Ga_{1-z2}As$, where $0.55 \leq z2 \leq 0.8$.

The $In_{x5}Ga_{1-x5}As_{1-y5}P_{y5}$ tensile strain barrier layers ($0 \leq x5 \leq 0.3$, $x5 < 0.49y5$) may be dispensed with. In this case, the active layer may be an $In_{x7}Ga_{1-x7}As_{1-y7}P_{y7}$ tensile strain quantum well active layer, where $0 \leq x7 \leq 0.4$, and $x7 < 0.49y7$.

When the stripe width of the semiconductor laser device as the tenth embodiment of the present invention is 1 to 5 μm, the semiconductor laser device can oscillate in a basic transverse mode.

Eleventh Embodiment

FIGS. 14A to 14D show cross sections of the representative stages in the process for producing a semiconductor laser device as the eleventh embodiment, where the cross sections are perpendicular to the direction of light emitted from the semiconductor laser device.

Figure 14B:
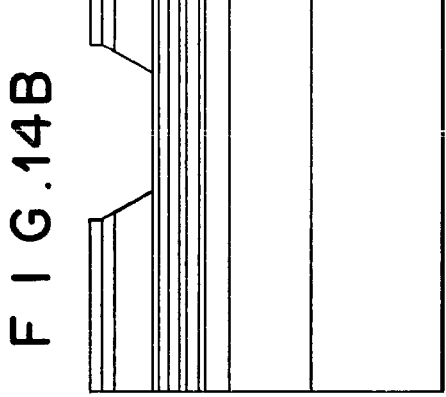
FIGS. 14A to 14D are cross-sectional views of representative stages in a process for producing a semiconductor laser device as the eleventh embodiment of the present invention.
Figure 14D:
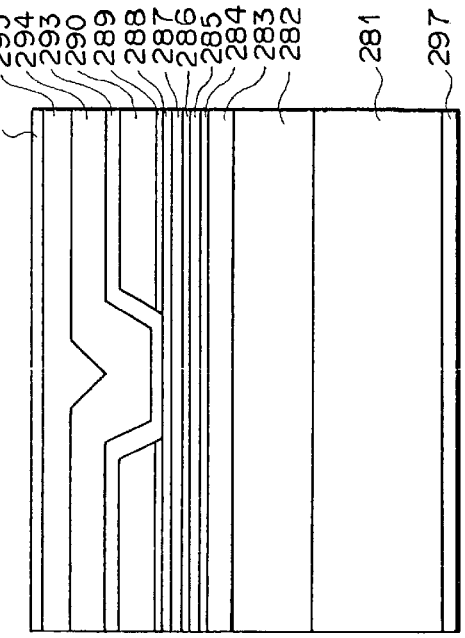
Figure 14A:
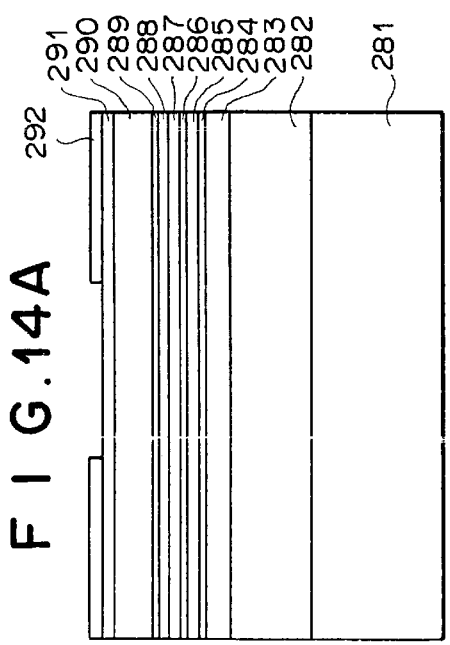

First, as illustrated in FIG. 14A, an n-type $In_{0.49}(Al_{z1}Ga_{1-z1})_{0.51}P$ lower cladding layer 282 ($0 \leq z1 \leq 1$), an n-type or i-type $In_{x2}Ga_{1-x2}As_{1-y2}P_{y2}$ lower optical waveguide layer 283 ($x2=(0.49\pm0.01)y2$, $0 \leq x2 \leq 0.3$), an $In_{x5}Ga_{1-x5}As_{1-y5}P_{y5}$ tensile strain barrier layer 284 ($0 \leq x5 \leq 0.3$, $x5 < 0.49y5$), an $In_{x3}Ga_{1-x3}As_{1-y3}P_{y3}$ compressive strain quantum well active layer 285 ($0 < x3 \leq 0.4$, $x3 > 0.49y3$), an $In_{x5}Ga_{1-x5}As_{1-y5}P_{y5}$ tensile strain barrier layer 286 ($0 \leq x5 \leq 0.3$, $x5 < 0.49y5$), a p-type or i-type $In_{x2}Ga_{1-x2}As_{1-y2}P_{y2}$ first upper optical waveguide layer 287, a p-type $In_{x9}Ga_{1-x9}P$ first etching stop layer 288 ($0 \leq x9 \leq 1$) having a thickness of, for example, 10 nm, a p-type $In_{x1}Ga_{1-x1}As_{1-y1}P_{y1}$ second etching stop layer 289 ($0 \leq x1 \leq 0.5$, $0 \leq y1 \leq 0.8$) having a thickness of, for example, 10 μm, an n-type $In_{0.49}(Al_{z2}Ga_{1-z2})_{0.51}P$ current confinement layer 290 ($0 < z2 \leq 0.1$) having a thickness of, for example, 1 μm, and an n-type GaAs cap layer 291 are formed on an n-type GaAs substrate 281 by organometallic vapor phase epitaxy. Then, a $SiO_2$ film 292 is formed over the n-type GaAs cap layer 291, and a stripe area of the $SiO_2$ film 292 having a width of about 3 μm and extending in the <011> direction is removed by conventional lithography so that a stripe area of the n-type GaAs cap layer 291 is exposed.

Next, as illustrated in FIG. 14B, the exposed stripe area of the n-type GaAs cap layer 291 is etched with a sulfuric acid etchant by using the $SiO_2$ film 292 as a mask. Then, a stripe area of the n-type $In_{0.49}(Al_{z2}Ga_{1-z2})_{0.51}P$ current confinement layer 290 is etched with a hydrochloric acid etchant until a stripe area of the p-type $In_{x1}Ga_{1-x1}As_{1-y1}P_{y1}$ second etching stop layer 289 is exposed.

Figure 14C:
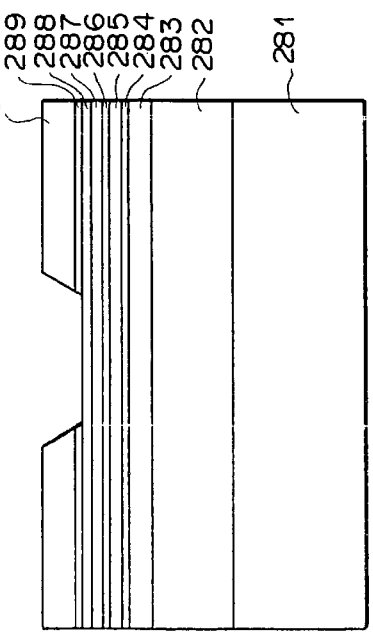

Thereafter, as illustrated in FIG. 14C, the remaining areas of the $SiO_2$ film 292 are removed by etching with a fluoric acid etchant. Then, the remaining areas of the n-type GaAs cap layer 291 and the exposed area of the p-type $In_{x1}Ga_{1-x1}As_{1-y1}P_{y1}$ second etching stop layer 289 are removed by etching with a sulfuric acid etchant so that a stripe area of the p-type $In_{x9}Ga_{1-x9}P$ first etching stop layer 288 is exposed.

Finally, as illustrated in FIG. 14D, a p-type $In_{x2}Ga_{1-x2}As_{1-y2}P_{y2}$ second upper optical waveguide layer 293, a p-type $In_{0.49}(Al_{z1}Ga_{1-z1})_{0.51}P$ upper cladding layer 294, and a p-type GaAs contact layer 295 are formed over the layered structure of FIG. 14C. Then, a p electrode 296 is formed on the p-type GaAs contact layer 295. In addition, the exposed surface of the substrate 281 is polished, and an n electrode 297 is formed on the polished surface of the substrate 281. Next, both end surfaces of the layered construction are cleaved, and a high reflectance coating and a low reflectance coating are provided on the respective end surfaces so as to form a resonator. Then, the above construction is formed into a chip of a semiconductor laser device.

Each of the lower and upper cladding layers of the semiconductor laser device as the eleventh embodiment of the present invention may be made of an $Al_{z2}Ga_{1-z2}As$ material ($0.3 \leq z2 \leq 0.8$) which lattice-matches with the GaAs substrate, or an $In_{x8}Ga_{1-x8}As_{1-y8}P_{y8}$ material (x8= 0.49y8) which has a band gap greater than the band gaps of the lower, first upper, and second upper optical waveguide layers, or an $In_x(Al_zGa_{1-z})_{1-x}As_{1-y}P_y$ material, where x=(0.49±0.01)y, and z and y are determined so that the band gap of each of the lower and upper cladding layers is greater than the band gaps of the lower, first upper, and second upper optical waveguide layers.

When the stripe width of the semiconductor laser device as the eleventh embodiment of the present invention is 1 to 5 μm, the semiconductor laser device can oscillate in a basic transverse mode.

When the active layer is made of a compressive strain type or tensile strain type $In_{x3}Ga_{1-x3}As_{1-y3}P_{y3}$ material, or an $In_{x3}Ga_{1-x3}As_{1-y3}P_{y3}$ material which lattice-matches with the GaAs substrate, the oscillation wavelength of the semiconductor laser device as the eleventh embodiment can be controlled in the range of 700 to 1,200 nm.

Twelfth Embodiment

In the solid-state laser apparatuses as the twelfth and thirteenth embodiments of the present invention, the semiconductor laser devices as the ninth to eleventh embodiments of the present invention can be used as excitation light sources which excite solid-state laser crystals.

Figure 15:
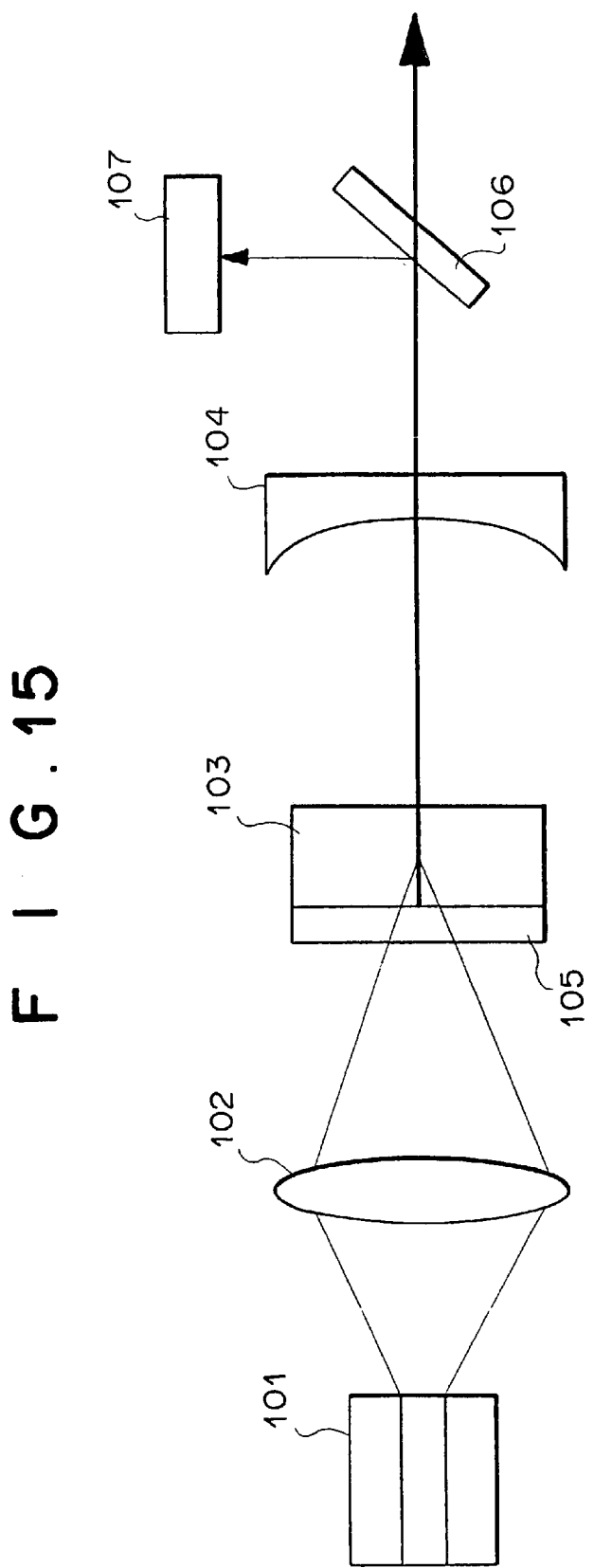
FIG. 15 is a diagram schematically illustrating the construction of a solid-state laser apparatus which uses as an excitation light source a semiconductor laser device according to the present invention.

FIG. 15 is a diagram schematically illustrating the construction of a solid-state laser apparatus which uses as an excitation light source a semiconductor laser device according to the present invention.

The solid-state laser apparatus of FIG. 15 comprises a high-power semiconductor laser device 101 which has a broad oscillation region, and emits excitation laser light, a lens 102 which collects the excitation laser light, a solid-state laser crystal 103 which is excited by the collected excitation laser light, and emits laser light, and an output mirror 104 which is a concave mirror arranged on the light exiting side of the solid-state laser crystal 103. The light exiting end surface of the semiconductor laser device 101 has a reflectance of 15 to 50% in order to reflect light returned from the solid-state laser crystal 103. The solid-state laser crystal 103 has a coating 105 at an end surface on the side of the semiconductor laser device 101, where the coating 105 has a high reflectance at the wavelength of the laser light emitted from the solid-state laser crystal 103, and a low reflectance at the wavelength of the excitation laser light from the semiconductor laser device 101.

The output mirror 104 and the coating 105 realize a resonator of the solid-state laser apparatus. The excitation laser light emitted from the semiconductor laser device 101 has a wavelength of 809 nm, and is collected by the lens 102 into the solid-state laser crystal 103. Only at least one component of the collected excitation laser light which can be coupled to oscillation modes of the resonator of the solid-state laser apparatus contributes to excitation of the solid-state laser crystal 103. Laser light having an oscillation wavelength of 946 nm is emitted from the solid-state laser crystal 103 through the output mirror 104. The semiconductor laser device 101 and the solid-state laser crystal 103 are temperature controlled using a Peltier element (not shown). A portion of the laser light which exits through the output mirror 104 branches off at a beam splitter 106 to a light receiving element 107 for APC (Automatic Power Control). That is, the intensity of the branched portion of the laser light is fed back to the semiconductor laser device 101 in order to maintain the intensity of the laser light output from the solid-state laser crystal 103 constant.

Since solid-state laser apparatus as the twelfth embodiment of the present invention uses the semiconductor laser device 101 according to the present invention, which generates low noise, and does not cause wavelength change, it is possible to obtain stable laser light without intensity variation from the solid-state laser apparatus of FIG. 15.

Thirteenth Embodiment

Figure 16:
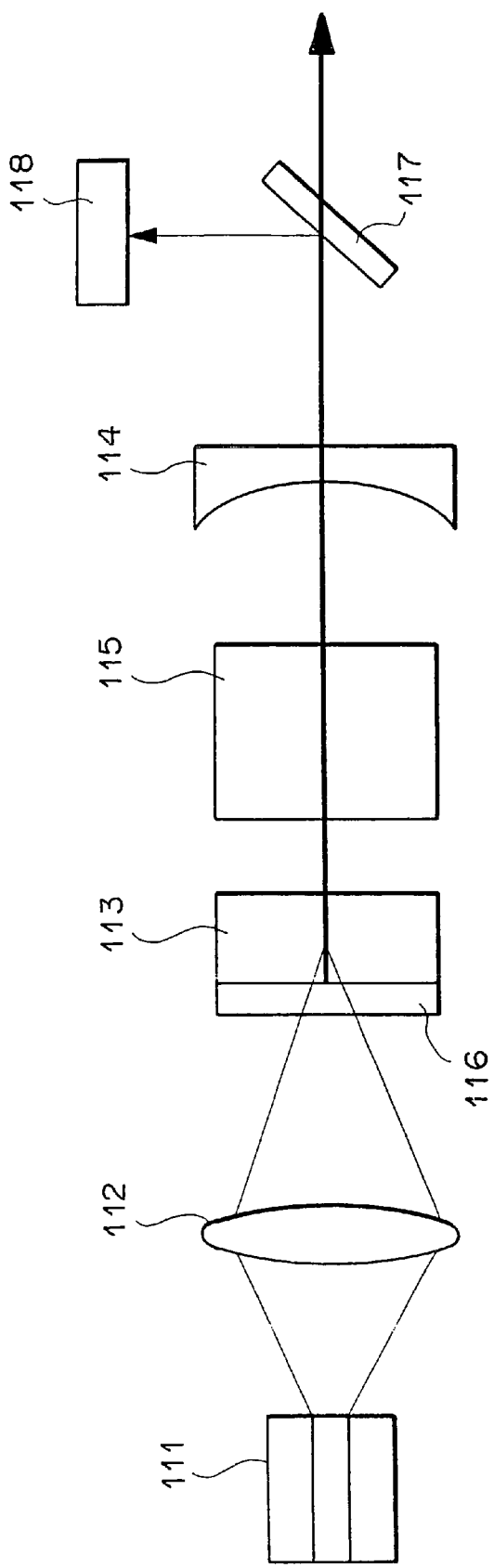
FIG. 16 is a diagram schematically illustrating the construction of another solid-state laser apparatus which uses as an excitation light source a semiconductor laser device according to the present invention.

FIG. 16 is a diagram schematically illustrating the construction of another solid-state laser apparatus using as an excitation light source a semiconductor laser device according to the present invention. The solid-state laser apparatus of FIG. 16 generates a second harmonic of laser light emitted from a solid-state laser crystal.

The solid-state laser apparatus of FIG. 16 comprises a high-power semiconductor laser device 111 which has a broad oscillation region, and emits excitation laser light, a lens 112 which collects the excitation laser light, a solid-state laser crystal 113 which is excited by the collected excitation laser light, and emits laser light, and an output mirror 114 which is a concave mirror arranged on the light exiting side of the solid-state laser crystal 113. The light exiting end surface of the semiconductor laser device 111 has a reflectance of 15 to 50% in order to reflect light returned from the solid-state laser crystal 113. The solid-state laser crystal 113 has a coating 116 at an end surface on the side of the semiconductor laser device 111, where the coating 116 has a high reflectance at the wavelength of the laser light emitted from the solid-state laser crystal 113, and a low reflectance at the wavelength of the excitation laser light from the semiconductor laser device 111.

The output mirror 114 and the coating 116 realize a resonator of the solid-state laser apparatus. In the resonator, a $KNbO_3$ nonlinear crystal 115 is arranged in order to convert the laser light emitted from the solid-state laser crystal 113 into a second harmonic, which has a wavelength one-half the wavelength of the laser light emitted from the solid-state laser crystal 113. The output mirror 114 has a high reflectance at the wavelength of the laser light emitted from the solid-state laser crystal 113, and passes the second harmonic generated by the nonlinear crystal 115. The solid-state laser crystal 113 may be Nd:$YVO_4$ or the like, and the $KNbO_3$ nonlinear crystal 115 may be replaced with a KTP crystal or the like. The semiconductor laser device 111, the solid-state laser crystal 113, and the $KNbO_3$ nonlinear crystal 115 are temperature controlled using a Peltier element (not shown). A portion of the laser light which exits through the output mirror 114 branches off at a beam splitter 117 to a light receiving element 118 for APC (Automatic Power Control). That is, the intensity of the branched portion of the laser light is fed back to the semiconductor laser device 111 in order to maintain the intensity of the laser light output from the solid-state laser crystal 113 constant.

The excitation laser light emitted from the semiconductor laser device 111 has a wavelength of 809 nm, and is collected by the lens 112 into the solid-state laser crystal 113. Only at least one component of the collected excitation laser light which can be coupled to oscillation modes of the resonator of the solid-state laser apparatus contributes to excitation of the solid-state laser crystal 113. Laser light having an oscillation wavelength of 946 nm is emitted from the solid-state laser crystal 113 through the output mirror 114, and converted into a second harmonic (blue laser light) having a wavelength of 473 nm by the nonlinear crystal 115. The second harmonic exits through the output mirror 114.

For the same reason as the twelfth embodiment, it is also possible to obtain stable laser light without intensity variation from the solid-state laser apparatus of FIG. 16.

Additional Matters to the Ninth to Thirteenth Embodiments (i) Each layer in the semiconductor laser devices as the ninth to eleventh embodiments may be formed by molecular beam epitaxy using solid or gas raw material.

(ii) Although n-type GaAs substrates are used in the constructions of the ninth to eleventh embodiments, instead, p-type GaAs substrates may be used. When the GaAs substrate is a p-type, the conductivity types of all of the other layers in the constructions of the ninth to eleventh embodiments should be inverted.

(iii) In addition, all of the contents of the Japanese patent application, Nos. 11(1999)-329866 and 2000-031733 are incorporated into this specification by reference.

What is claimed is:

1. A semiconductor laser device comprising:

a GaAs substrate of a first conductive type;

a lower cladding layer of said first conductive type, formed on said GaAs substrate;

a lower optical waveguide layer formed on said lower cladding layer;

a compressive strain quantum well active layer made of $In_{x3}Ga_{1-x3}As_{1-y3}P_{y3}$, and formed on said lower optical waveguide layer, where $0<x3\leq0.4$, $0\leq y3\leq0.1$, and an absolute value of a first product of a strain of said compressive strain quantum well active layer and a thickness of said compressive strain quantum well active layer is equal to or smaller than 0.25 nm;

an upper optical waveguide layer formed on said compressive strain quantum well active layer;

a first upper cladding layer made of $In_{x8}Ga_{1-x8}P$ of a second conductive type, and formed on said upper optical waveguide layer;

an etching stop layer made of $In_{x1}Ga_{1-x1}As_{1-y1}P_{y1}$ of said second conductive type, and formed on said first upper cladding layer other than a stripe area of said first upper cladding layer so as to form a first portion of a stripe groove realizing a current injection window, where $0\leq x1\leq0.3$, $0\leq y1\leq0.3$, and an absolute value of a second product of a strain of said etching stop layer and a thickness of said etching stop layer is equal to or smaller than 0.25 nm;

a current confinement layer made of $In_{x8}Ga_{1-x8}P$ of said first conductive type, and formed on said etching stop layer so as to form a second portion of said stripe groove, where $x8=0.49\pm0.01$;

a second upper cladding layer made of $Al_{z4}Ga_{1-z4}As$ of said second conductive type, and formed over said current confinement layer and said stripe area of the first upper cladding layer so as to cover said stripe groove, where $0.20\leq z4\leq0.50$; and a contact layer of said second conductive type, formed on said second upper cladding layer;

wherein each of said lower cladding layer, said lower optical waveguide layer, said upper optical waveguide layer, said first upper cladding layer, said current confinement layer, said second upper cladding layer, and said contact layer has such a composition as to lattice-match with said GaAs substrate.

2. A semiconductor laser device according to claim 1, further comprising first and second tensile strain barrier layers both made of $In_{x5}Ga_{1-x5}As_{1-y5}P_{y5}$, and respectively formed above and below said compressive strain quantum well active layer, where $0\leq x5\leq0.3$ and $0<y5\leq0.6$, and an absolute value of a sum of said first product and a third product of a strain of said first and second tensile strain barrier layers and a total thickness of the first and second tensile strain barrier layers is equal to or smaller than 0.25 nm.

3. A semiconductor laser device according to claim 1, further comprising an additional layer being made of $In_{x8}Ga_{1-x8}P$ of said second conductive type, formed below said second upper cladding layer, and having a thickness between 10 to 400 nm, where $x8=0.49\pm0.01$.

4. A semiconductor laser device according to claim 1, wherein said stripe groove has a width equal to or greater than 1 μm.

5. A semiconductor laser device comprising:

a GaAs substrate of a first conductive type;

a lower cladding layer of said first conductive type, formed on said GaAs substrate;

a lower optical waveguide layer formed on said lower cladding layer;

a compressive strain quantum well active layer made of $In_{x3}Ga_{1-x3}As_{1-y3}P_{y3}$, and formed on said lower optical waveguide layer, where $0 \leq x3 \leq 0.4$, and $0 \leq y3 \leq 0.1$, and an absolute value of a first product of a strain of said compressive strain quantum well active layer and a thickness of said compressive strain quantum well active layer is equal to or smaller than 0.25 nm;

an upper optical waveguide layer formed on said compressive strain quantum well active layer;

a first upper cladding layer of a second conductive type, formed on said upper optical waveguide layer;

a first etching stop layer made of $In_{x7}Ga_{1-x7}P$ of said second conductive type, and formed on said first upper cladding layer, where $0 \leq x7 \leq 1$;

a second etching stop layer made of $In_{x1}Ga_{1-x1}As_{1-y1}P_{y1}$ of said second conductive type, and formed on said first etching stop layer other than a stripe area of said first etching stop layer so as to form a first portion of a stripe groove realizing a current injection window, where $0 \leq x1 \leq 0.3$, and $0 \leq y1 \leq 0.3$;

a current confinement layer made of $In_{x8}Ga_{1-x8}P$ of said first conductive type, and formed on said second etching stop layer so as to form a second portion of said stripe groove, where $x8 = 0.49 \pm 0.01$;

a second upper cladding layer made of $Al_{z4}Ga_{1-z4}As$ of said second conductive type, and formed over said current confinement layer and said stripe area of the first upper cladding layer so as to cover said stripe groove, where $0.20 \leq z4 \leq 0.50$; and a contact layer of said second conductive type, formed on said second upper cladding layer;

wherein each of said lower cladding layer, said lower optical waveguide layer, said upper optical waveguide layer, said first upper cladding layer, said current confinement layer, said second upper cladding layer, and said contact layer has such a composition as to lattice-match with said GaAs substrate, and an absolute value of a sum of a second product of a strain of said first etching stop layer and a thickness of said first etching stop layer and a third product of a strain of said second etching stop layer and a thickness of said second etching stop layer is equal to or smaller than 0.25 nm.

6. A semiconductor laser device according to claim 5, further comprising first and second tensile strain barrier layers both made of $In_{x5}Ga_{1-x5}As_{1-y5}P_{y5}$, and respectively formed above and below said compressive strain quantum well active layer, where $0 \leq x5 \leq 0.3$ and $0 < y5 \leq 0.6$, and an absolute value of a sum of said first product and a fourth product of a strain of said first and second tensile strain barrier layers and a total thickness of the first and second tensile strain barrier layers is equal to or smaller than 0.25 nm.

7. A semiconductor laser device according to claim 5, further comprising an additional layer being made of $In_{x8}Ga_{1-x8}P$ of said second conductive type, formed below said second upper cladding layer, and having a thickness between 10 to 400 nm, where $x8 = 0.49 \pm 0.01$.

8. A semiconductor laser device according to claim 5, wherein said first upper cladding layer is made of $In_{x6}Ga_{1-x6}As_{1-y6}P_{y6}$ or $Al_{z5}Ga_{1-z5}As$, where $x6 = (0.49 \pm 0.01)y6$, $0.2 < y6 < 1$, and $0.25 \leq z5 \leq 0.7$.

9. A semiconductor laser device according to claim 5, wherein said stripe groove has a width equal to or greater than 1 μm.

10. A semiconductor laser device comprising:

a GaAs substrate of a first conductive type;

a lower cladding layer of said first conductive type, and formed on said GaAs substrate;

a lower optical waveguide layer of an undoped type or said first conductive type, and formed on said lower cladding layer;

an active layer formed on said lower optical waveguide layer;

a first upper optical waveguide layer of an undoped type or a second conductive type, and formed on said active layer;

an etching stop layer made of $In_{x1}Ga_{1-x1}As_{1-y1}P_{y1}$ of said second conductive type, and formed on said first upper optical waveguide layer other than a stripe area of said first upper optical waveguide layer so as to form a first portion of a stripe groove realizing a current injection window, where $0 \leq x1 \leq 0.5$, and $0 \leq y1 \leq 0.8$;

a current confinement layer made of $In_{x3}(Al_{z3}Ga_{1-z3})_{1-x3}P$ of said first conductive type, and formed on said etching stop layer so as to form a second portion of said stripe groove, where $0 < z3 \leq 1$, and $x3 = 0.49 \pm 0.01$;

a second upper optical waveguide layer of said second conductive type, and formed over said current confinement layer and said stripe area of said first upper optical waveguide layer so as to cover said stripe groove;

an upper cladding layer of said second conductive type, formed on said second upper optical waveguide layer; and a contact layer made of GaAs of said second conductive type, and formed on said upper cladding layer;

wherein a total thickness of said lower optical waveguide layer and said first and second upper optical waveguide layers is equal to or greater than 0.6 μm, and said active layer is made of one of InGaAs, InGaAsP, and GaAsP.

11. A semiconductor laser device according to claim 10, further comprising a cap layer made of $In_{0.49}Ga_{0.51}P$ of said first or second conductive type, and formed between said current confinement layer and said second upper optical waveguide layer.

12. A semiconductor laser device according to claim 10, wherein each of said lower optical waveguide layer and said first and second upper optical waveguide layers is made of $In_{x2}Ga_{1-x2}P$, where $x2 = 0.49 \pm 0.01$.

13. A semiconductor laser device according to claim 10, wherein each of said lower optical waveguide layer and said first and second upper optical waveguide layers is made of $In_{x2}Ga_{1-x2}As_{y2}P_{1-y2}$, where $x2 = (0.49 \pm 0.01)y2$, and $0 \leq x2 \leq 0.49$.

14. A semiconductor laser device according to claim 10, further comprising first and second tensile strain barrier layers made of one of InGaP, InGaAsP, and GaAsP, and respectively formed above and below said active layer.

15. A semiconductor laser device according to claim 10, wherein each of said lower and upper cladding layers is made of one of AlGaAs, InGaAlP, and InGaAlPAs which lattice-match with the GaAs substrate.

16. A semiconductor laser device according to claim 10, wherein a bottom of said stripe groove has a width of 1 to 5 μm, and a difference in an equivalent refractive index caused by a difference in a refractive index between said current confinement layer and said second upper optical waveguide layer is in a range from 0.0015 to 0.01.

17. A semiconductor laser device according to claim 10, wherein a bottom of said stripe groove has a width equal to or greater than 10 μm.

18. A semiconductor laser device comprising:

a GaAs substrate of a first conductive type;

a lower cladding layer of said first conductive type, formed on said GaAs substrate;

a lower optical waveguide layer of an undoped type or said first conductive type, formed on said lower cladding layer;

an active layer formed on said lower optical waveguide layer;

a first upper optical waveguide layer of an undoped type or a second conductive type, formed on said active layer;

a first etching stop layer made of $In_{x9}Ga_{1-x9}P$ of said second conductive type, and formed on said first upper optical waveguide layer, where $0 \leq x9 \leq 1$;

a second etching stop layer made of $In_{x1}Ga_{1-x1}As_{1-y1}P_{y1}$ of said second conductive type, and formed on said first etching stop layer other than a stripe area of said first etching stop layer so as to form a first portion of a stripe groove realizing a current injection window, where $0 \leq x1 \leq 0.5$, and $0 \leq y1 \leq 0.8$;

a current confinement layer made of $In_{x3}(Al_{z3}Ga_{1-z3})_{1-x3}P$ of said first conductive type, and formed on said second etching stop layer so as to form a second portion of said stripe groove, where $0 < z3 \leq 1$, and $x3=0.49\pm0.01$;

a second upper optical waveguide layer of said second conductive type, formed over said current confinement layer and said stripe area of said first etching stop layer so as to cover said stripe groove;

an upper cladding layer of said second conductive type, formed on said second upper optical waveguide layer; and a contact layer made of GaAs of said second conductive type, and formed on said upper cladding layer;

wherein a total thickness of said lower optical waveguide layer and said first and second upper optical waveguide layers is equal to or greater than 0.6 μm, and said active layer is made of one of InGaAs, InGaAsP, and GaAsP.

19. A semiconductor laser device according to claim 18, further comprising a cap layer made of $In_{0.49}Ga_{0.51}P$ of said first or second conductive type, and formed between said current confinement layer and said second upper optical waveguide layer.

20. A semiconductor laser device according to claim 18, wherein each of said lower optical waveguide layer and said first and second upper optical waveguide layers is made of $In_{x2}Ga_{1-x2}P$, where $x2=0.49\pm0.01$.

21. A semiconductor laser device according to claim 18, wherein each of said lower optical waveguide layer and said first and second upper optical waveguide layers is made of $In_{x2}Ga_{1-x2}As_{y2}P_{1-y2}$, where $x2=(0.49\pm0.01)y2$, and $0 \leq x2 \leq 0.49$.

22. A semiconductor laser device according to claim 18, further comprising first and second tensile strain barrier layers made of one of InGaP, InGaAsP, and GaAsP, and respectively formed above and below said active layer.

23. A semiconductor laser device according to claim 18, wherein each of said lower and upper cladding layers is made of one of AlGaAs, InGaAlP, and InGaAlPAs which lattice-match with the GaAs substrate.

24. A semiconductor laser device according to claim 18, wherein a bottom of said stripe groove has a width of 1 to 5 μm, and a difference in an equivalent refractive index caused by a difference in a refractive index between said current confinement layer and said second upper optical waveguide layer is in a range from 0.0015 to 0.01.

25. A semiconductor laser device according to claim 18, wherein a bottom of said stripe groove has a width equal to or greater than 10 μm.

26. A solid-state laser apparatus having as an exciting light source a semiconductor laser device comprising:

a GaAs substrate of a first conductive type;

a lower cladding layer of said first conductive type, formed on said GaAs substrate;

a lower optical waveguide layer of an undoped type or said first conductive type, formed on said lower cladding layer;

an active layer formed on said lower optical waveguide layer;

a first upper optical waveguide layer of an undoped type or a second conductive type, formed on said active layer;

an etching stop layer made of $In_{x1}Ga_{1-x1}As_{1-y1}P_{y1}$ of said second conductive type, and formed on said first upper optical waveguide layer other than a stripe area of said first upper optical waveguide layer so as to form a first portion of a stripe groove realizing a current injection window, where $0 \leq x1 \leq 0.5$, and $0 \leq y1 \leq 0.8$;

a current confinement layer made of $In_{x3}(Al_{z3}Ga_{1-z3})_{1-x3}P$ of said first conductive type, and formed on said etching stop layer so as to form a second portion of said stripe groove, where $0 < z3 \leq 1$, and $x3=0.49\pm0.01$;

a second upper optical waveguide layer of said second conductive type, formed over said current confinement layer and said stripe area of said first upper optical waveguide layer so as to cover said stripe groove;

an upper cladding layer of said second conductive type, formed on said second upper optical waveguide layer; and a contact layer made of GaAs of said second conductive type, and formed on said upper cladding layer;

wherein a total thickness of said lower optical waveguide layer and said first and second upper optical waveguide layers is equal to or greater than 0.6 μm, and said active layer is made of one of InGaAs, InGaAsP, and GaAsP.

27. A solid-state laser apparatus according to claim 26, further comprising a cap layer made of $In_{0.49}Ga_{0.51}P$ of said first or second conductive type, and formed between said current confinement layer and said second upper optical waveguide layer.

28. A solid-state laser apparatus according to claim 26, wherein each of said lower optical waveguide layer and said first and second upper optical waveguide layers is made of $In_{x2}Ga_{1-x2}P$, where $x2=0.49\pm0.01$.

29. A solid-state laser apparatus according to claim 26, wherein each of said lower optical waveguide layer and said first and second upper optical waveguide layers is made of $In_{x2}Ga_{1-x2}As_{y2}P_{1-y2}$, where $x2=(0.49\pm0.01)y2$, and $0 \leq x2 \leq 0.49$.

30. A solid-state laser apparatus according to claim 26, further comprising first and second tensile strain barrier layers made of one of InGaP, InGaAsP, and GaAsP, and respectively formed above and below said active layer.

31. A solid-state laser apparatus according to claim 26, wherein each of said lower and upper cladding layers is made of one of AlGaAs, InGaAlP, and InGaAlPAs which lattice-match with the GaAs substrate.

32. A solid-state laser apparatus according to claim 26, wherein a bottom of said stripe groove has a width of 1 to 5 µm, and a difference in an equivalent refractive index caused by a difference in a refractive index between said current confinement layer and said second upper optical waveguide layer is in a range from 0.0015 to 0.01.

33. A solid-state laser apparatus according to claim 26, wherein a bottom of said stripe groove has a width equal to or greater than 10 µm.

34. A solid-state laser apparatus according to claim 26, further comprising a solid-state laser crystal which is excited with first laser light emitted from said excitation light source, and emits second laser light, and a wavelength conversion crystal which converts said second laser light into a second harmonic.

35. A solid-state laser apparatus having as an exciting light source a semiconductor laser device comprising:
    a GaAs substrate of a first conductive type;
    a lower cladding layer of said first conductive type, formed on said GaAs substrate;
    a lower optical waveguide layer of an undoped type or said first conductive type, formed on said lower cladding layer;
    an active layer formed on said lower optical waveguide layer;
    a first upper optical waveguide layer of an undoped type or a second conductive type, formed on said active layer;
    a first etching stop layer made of $In_{x9}Ga_{1-x9}P$ of said second conductive type, and formed on said first upper optical waveguide layer, where $0 \leq x9 \leq 1$;
    a second etching stop layer made of $In_{x1}Ga_{1-x1}As_{1-y1}P_{y1}$ of said second conductive type, and formed on said first etching stop layer other than a stripe area of said first etching stop layer so as to form a first portion of a stripe groove realizing a current injection window, where $0 \leq x1 \leq 0.5$, and $0 \leq y1 \leq 0.8$;
    a current confinement layer made of $In_{x3}(Al_{z3}Ga_{1-z3})_{1-x3}P$ of said first conductive type, and formed on said second etching stop layer so as to form a second portion of said stripe groove, where $0 < z3 \leq 1$, and $x3=0.49\pm0.01$;
    a second upper optical waveguide layer of said second conductive type, formed over said current confinement layer and said stripe area of said first etching stop layer so as to cover said stripe groove;
    an upper cladding layer of said second conductive type, formed on said second upper optical waveguide layer; and
    a contact layer made of GaAs of said second conductive type, and formed on said upper cladding layer;
    wherein a total thickness of said lower optical waveguide layer and said first and second upper optical waveguide layers is equal to or greater than 0.6 µm, and said active layer is made of one of InGaAs, InGaAsP, and GaAsP.

36. A solid-state laser apparatus according to claim 35, further comprising a cap layer made of $In_{0.49}Ga_{0.51}P$ of said first or second conductive type, and formed between said current confinement layer and said second upper optical waveguide layer.

37. A solid-state laser apparatus according to claim 49, wherein each of said lower optical waveguide layer and said first and second upper optical waveguide layers is made of $In_{x2}Ga_{1-x2}P$, where $x2=0.49\pm0.01$.

38. A solid-state laser apparatus according to claim 35, wherein each of said lower optical waveguide layer and said first and second upper optical waveguide layers is made of $In_{x2}Ga_{1-x2}As_{y2}P_{1-y2}$, where $x2=(0.49\pm0.01)y2$, and $0 \leq x2 \leq 0.49$.

39. A solid-state laser apparatus according to claim 35, further comprising first and second tensile strain barrier layers made of one of InGaP, InGaAsP, and GaAsP, and respectively formed above and below said active layer.

40. A solid-state laser apparatus according to claim 35, wherein each of said lower and upper cladding layers is made of one of AlGaAs, InGaAlP, and InGaAlPAs which lattice-match with the GaAs substrate.

41. A solid-state laser apparatus according to claim 35, wherein a bottom of said stripe groove has a width of 1 to 5 µm, and a difference in an equivalent refractive index caused by a difference in a refractive index between said current confinement layer and said second upper optical waveguide layer is in a range from 0.0015 to 0.01.

42. A solid-state laser apparatus according to claim 35, wherein a bottom of said stripe groove has a width equal to or greater than 10 µm.

43. A solid-state laser apparatus according to claim 35, further comprising a solid-state laser crystal which is excited with first laser light emitted from said excitation light source, and emits second laser light, and a wavelength conversion crystal which converts said second laser light into a second harmonic.

* * * * *